(12) United States Patent
Lu et al.

(10) Patent No.: US 10,403,631 B1
(45) Date of Patent: Sep. 3, 2019

(54) THREE-DIMENSIONAL FERROELECTRIC MEMORY DEVICES

(71) Applicant: Wuxi Petabyte Technologies Co., Ltd., Wuxi (CN)

(72) Inventors: Zhenyu Lu, Boise, ID (US); Yushi Hu, McLean, VA (US); Qian Tao, Boise, ID (US)

(73) Assignee: Wuxi Petabyte Technologies Co., Ltd., Wuxi (CN)

( * ) Notice: Subject to any disclaimer, the term of this patent is extended or adjusted under 35 U.S.C. 154(b) by 0 days.

(21) Appl. No.: 16/102,667

(22) Filed: Aug. 13, 2018

(51) Int. Cl.
| | |
|---|---|
| *H01L 27/11514* | (2017.01) |
| *G11C 11/22* | (2006.01) |
| *H01L 21/768* | (2006.01) |
| *G11C 7/18* | (2006.01) |
| *G11C 8/14* | (2006.01) |
| *H01L 23/532* | (2006.01) |

(52) U.S. Cl.
CPC ......... *H01L 27/11514* (2013.01); *G11C 7/18* (2013.01); *G11C 8/14* (2013.01); *G11C 11/221* (2013.01); *H01L 21/76816* (2013.01); *H01L 21/76829* (2013.01); *H01L 23/5329* (2013.01)

(58) Field of Classification Search
CPC ......... H01L 27/11507; H01L 27/11514; G11C 11/221
See application file for complete search history.

(56) References Cited

U.S. PATENT DOCUMENTS

| | | | |
|---|---|---|---|
| 8,937,292 B2 * | 1/2015 | Bateman | H01L 27/2454 257/5 |
| 9,698,272 B1 * | 7/2017 | Ikeda | H01L 29/78606 |
| 9,761,580 B1 * | 9/2017 | Ramaswamy | H01L 28/60 |
| 9,935,114 B1 * | 4/2018 | Chavan | H01L 27/11507 |
| 10,049,720 B2 * | 8/2018 | Tanaka | G11C 11/404 |
| 10,153,018 B2 * | 12/2018 | Derner | G11C 11/221 |

* cited by examiner

*Primary Examiner* — Allison Bernstein
(74) *Attorney, Agent, or Firm* — Bayes PLLC

(57) ABSTRACT

Embodiments of three-dimensional (3D) ferroelectric memory devices and methods for forming the ferroelectric memory devices are disclosed. In an example, a 3D ferroelectric memory device includes a substrate and a plurality of ferroelectric memory cells each extending vertically above the substrate. Each of the ferroelectric memory cells includes a capacitor and a transistor electrically connected to the capacitor. The capacitor includes a first electrode, a second electrode, and a ferroelectric layer disposed laterally between the first electrode and the second electrode. The transistor includes a channel structure, a gate conductor, and a gate dielectric layer disposed laterally between the channel structure and the gate conductor.

30 Claims, 23 Drawing Sheets

THREE-DIMENSIONAL FERROELECTRIC MEMORY DEVICES

BACKGROUND

Embodiments of the present disclosure relate to ferroelectric memory devices and fabrication methods thereof.

Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

BRIEF SUMMARY

Embodiments of three-dimensional (3D) ferroelectric memory devices and fabrication methods thereof are disclosed herein.

In some embodiments, a 3D ferroelectric memory device includes a substrate and a plurality of ferroelectric memory cells each extending vertically above the substrate. Each of the ferroelectric memory cells includes a capacitor and a transistor electrically connected to the capacitor. The capacitor includes a first electrode, a second electrode, and a ferroelectric layer disposed laterally between the first electrode and the second electrode. The transistor includes a channel structure, a gate conductor, and a gate dielectric layer disposed laterally between the channel structure and the gate conductor.

In some embodiments, the transistor is disposed above the capacitor. In some embodiments, the channel structure is above and electrically connected to the first electrode.

In some embodiments, the 3D ferroelectric memory device further includes a capacitor gate stack through which the capacitor extends vertically. The capacitor gate stack includes a conductor layer extending laterally and in contact with the second electrode, a first dielectric layer disposed below the conductor layer, and a second dielectric layer disposed above the conductor layer. In some embodiments, the 3D ferroelectric memory device further includes a stop layer disposed below the capacitor gate stack. A lower portion of the capacitor is in contact with the stop layer.

In some embodiments, the 3D ferroelectric memory further includes a plurality of bit lines and a plurality of bit line contacts. Each of the bit line contacts is in contact with one of the bit lines and a source/drain region of one of the transistors.

In some embodiments, each of the ferroelectric memory cell is in a substantially circular shape in a plan view. In some embodiments, the channel structure, the gate dielectric layer, and the gate conductor are disposed radially from a center of the ferroelectric memory cell in this order.

In some embodiments, the ferroelectric layer includes oxygen and at least one of hafnium (Hf), Zirconium (Zr), Titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb). In some embodiments, the first electrode includes silicon (Si), titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), and ruthenium oxide (RuOx).

In some embodiments, the first or the second electrode includes a transparent conductive oxide (TCO). TCOs include, but are not limited to, doped ZnO based TCOs, doped $TiO_2$ based TCOs, doped $SnO_2$ based TCOs, and Perovskite TCOs.

In some embodiments, the 3D ferroelectric memory further includes a peripheral device disposed below the ferroelectric memory cells.

In some embodiments, a 3D ferroelectric memory device includes a substrate and a ferroelectric memory cell extending vertically above the substrate. The ferroelectric memory cell includes a plurality of capacitors stacked vertically and a transistor electrically connected to the capacitors. Each of the capacitors includes a first electrode, a second electrode, and a ferroelectric layer disposed laterally between the first electrode and the second electrode. The transistor includes a channel structure, a gate conductor, and a gate dielectric layer disposed laterally between the channel structure and the gate conductor.

In some embodiments, the first electrodes in each of the ferroelectric memory cells are parts of a continuous electrode. The channel structure can be above and electrically connected to the continuous electrode. In some embodiments, the ferroelectric layers in each of the capacitors are parts of a continuous ferroelectric layer. In some embodiments, the second electrodes in each of the capacitors are electrically isolated from one another.

In some embodiments, the 3D ferroelectric memory device further includes a plurality of capacitor gate stacks through which the capacitors extend vertically. Each of the capacitor gate stacks includes a conductor layer extending laterally and in contact with one of the second electrodes, a first dielectric layer disposed below the conductor layer, and a second dielectric layer disposed above the conductor layer. In some embodiments, the 3D ferroelectric memory further includes a stop layer disposed below the capacitor gate stacks. A lower portion of the capacitors is in contact with the stop layer.

In some embodiments, the 3D ferroelectric memory device further includes a plurality of bit lines and a plurality of bit line contacts. Each of the bit line contacts is in contact with one of the bit lines and a source/drain region of one of the transistors.

In some embodiments, the ferroelectric memory cell is in a substantially circular shape in a plan view. In some embodiments, the channel structure, the gate dielectric layer, and the gate conductor are disposed radially from a center of the ferroelectric memory cell in this order. The ferroelectric layer is part of a continuous layer across at least two of the capacitors, according to some embodiments.

In some embodiments, the ferroelectric layer includes oxygen and at least one of hafnium (Hf), Zirconium (Zr), Titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb). In some embodiments, the first electrode includes silicon (Si), titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), and ruthenium oxide (RuOx).

In some embodiments, the first or the second electrode includes a transparent conductive oxide (TCO). TCOs include, but are not limited to, doped ZnO based TCOs, doped $TiO_2$ based TCOs, doped $SnO_2$ based TCOs, and Perovskite TCOs.

In some embodiments, a vertical dimension of at least two of the second electrodes is not the same.

In some embodiments, the 3D ferroelectric memory device further includes a peripheral device disposed below the ferroelectric memory cell.

In some embodiments, a 3D ferroelectric memory device includes a substrate, a first ferroelectric memory cell extending vertically above the substrate, a second ferroelectric memory cell extending vertically above the first ferroelectric memory cell, and a bit line disposed vertically between and electrically connected to the first transistor and the second transistor. The first ferroelectric memory cell includes a first ferroelectric capacitor and a first transistor disposed above and electrically connected to the first ferroelectric capacitor. The second ferroelectric memory cell includes a second transistor and a second ferroelectric capacitor disposed above and electrically connected to the second transistor.

In some embodiments, each of the first and second ferroelectric capacitors includes a first electrode, a second electrode, and a ferroelectric layer disposed laterally between the first electrode and the second electrode. In some embodiments, each of the first and second transistors includes a channel structure, a gate conductor, and a gate dielectric layer disposed laterally between the channel structure and the gate conductor.

In some embodiments, for the first ferroelectric memory cell, the corresponding channel structure is above and electrically connected to the corresponding first electrode, and for the second ferroelectric memory cell, the corresponding channel structure is below and electrically connected to the corresponding first electrode.

In some embodiments, the 3D ferroelectric memory device further includes a first capacitor gate stack through which the first ferroelectric capacitor extends vertically and a second capacitor gate stack through which the second ferroelectric capacitor extends vertically. The second capacitor is disposed above the first capacitor gate stack. Each of the first and second capacitor gate stacks includes a conductor layer extending laterally and in contact with the corresponding second electrode, a first dielectric layer disposed below the conductor layer, and a second dielectric layer disposed above the conductor layer. In some embodiments, the 3D ferroelectric memory device further includes a stop layer disposed below the first capacitor gate stack. A lower portion of the first ferroelectric capacitor is in contact with the stop layer.

In some embodiments, a first bit line contact in contact with the bit line and a source/drain region of the first transistor, and a second bit line contact in contact with the bit line and a source/drain region of the second transistor.

In some embodiments, each of the first and second ferroelectric memory cells is in a substantially circular shape in a plan view. In some embodiments, the channel structure, the gate dielectric layer, and the gate conductor are disposed radially from a center of the ferroelectric memory cell in this order.

In some embodiments, the ferroelectric layer includes oxygen and at least one of hafnium (Hf), Zirconium (Zr), Titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb). In some embodiments, the first electrode includes silicon (Si), titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), and ruthenium oxide (RuOx).

In some embodiments, the first or the second electrode includes a transparent conductive oxide (TCO). TCOs include, but are not limited to, doped ZnO based TCOs, doped $TiO_2$ based TCOs, doped $SnO_2$ based TCOs, and Perovskite TCOs.

In some embodiments, each of the first and second ferroelectric memory cells includes a plurality of ferroelectric capacitors stacked vertically.

In some embodiments, the 3D ferroelectric memory device further includes a peripheral device disposed below the first ferroelectric memory cell.

In some embodiments, the 3D ferroelectric memory device further includes a third ferroelectric memory cell extending vertically above second ferroelectric memory cell, a fourth ferroelectric memory cell extending vertically above the third ferroelectric memory cell, and another bit line disposed vertically between and electrically connected to the third transistor and the fourth transistor. The third ferroelectric memory cell includes a third ferroelectric capacitor and a third transistor disposed above and electrically connected to the third ferroelectric capacitor. The fourth ferroelectric memory cell includes a fourth transistor and a fourth ferroelectric capacitor disposed above and electrically connected to the fourth transistor.

In some embodiments, a method for forming a 3D ferroelectric memory device is provided. A capacitor gate stack is formed above a substrate. The capacitor gate stack can include a conductor layer extending laterally, a first dielectric layer disposed below the conductor layer, and a second dielectric layer disposed above the conductor layer. One or more capacitors extending vertically through the capacitor gate stack are formed. Each capacitor can include a first electrode, a second electrode, and a ferroelectric layer formed laterally between the first electrode and the second electrode. A transistor is formed above and electrically connected to the capacitors. The transistor can include a channel structure, a gate conductor, and a gate dielectric layer formed laterally between the channel structure and the gate conductor. A bit line contact and a bit line are formed above the transistor. The bit line contact can be in contact with the bit line and a source/drain region of the transistor.

In some embodiments, a method for forming a 3D ferroelectric memory device is provided. A first ferroelectric memory cell extending vertically is formed above a substrate. The first ferroelectric memory cell can include a first ferroelectric capacitor and a first transistor formed above and electrically connected to the first ferroelectric capacitor. A bit line is formed above and electrically connected to the first ferroelectric memory cell. A second ferroelectric memory cell extending vertically is formed above and electrically connected to the bit line. The second ferroelectric memory cell includes a second transistor and a second ferroelectric capacitor formed above and electrically connected to the second transistor.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1A:
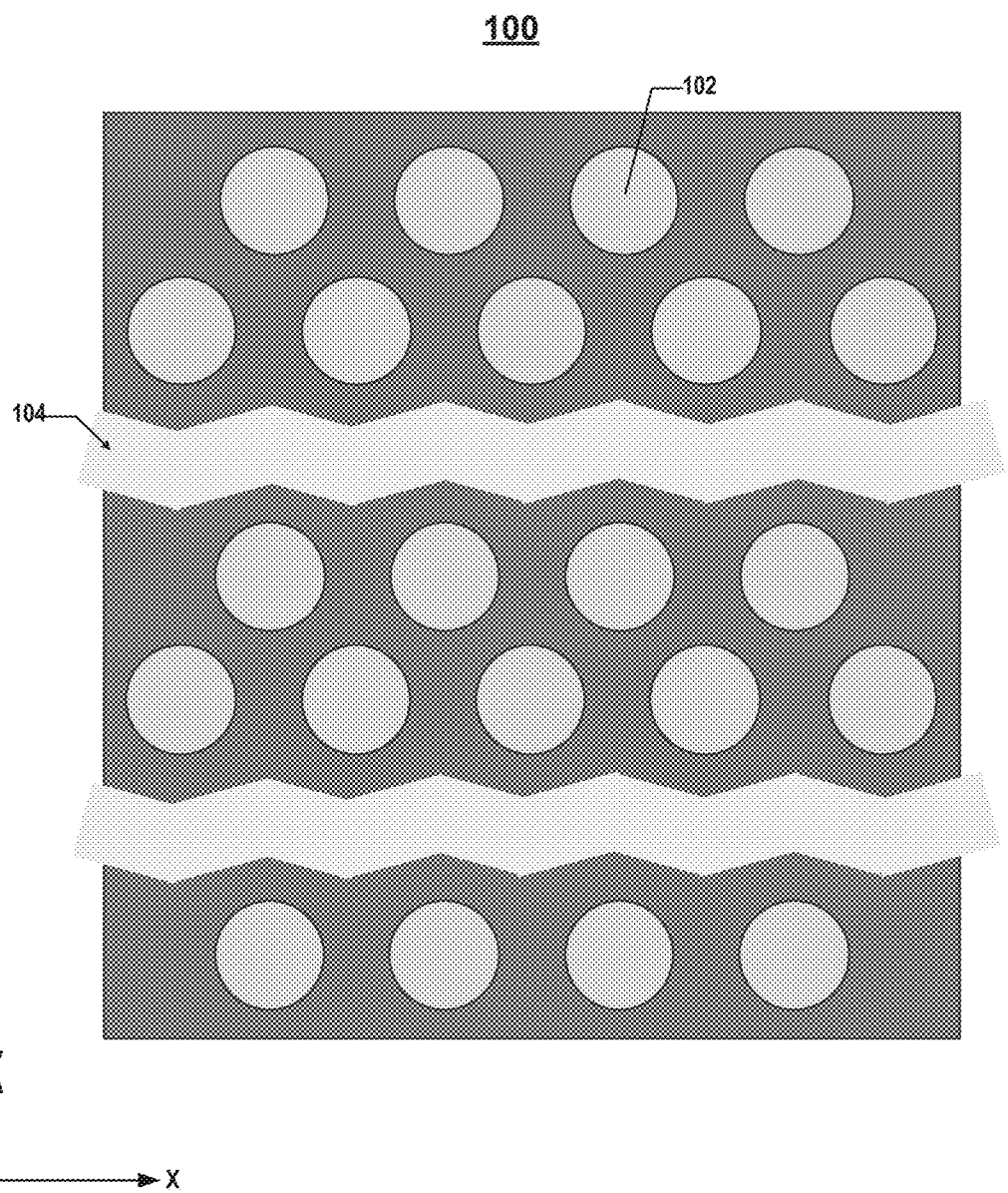
FIG. 1A illustrates a plan view of an exemplary 3D ferroelectric memory device, according to some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented memory cell (s) (referred to herein as "memory string(s)") on a laterally-oriented substrate so that the memory strings extend in the vertical direction with respect to the substrate. As used herein, the term "vertical/vertically" means nominally perpendicular to the lateral surface of a substrate.

One major limitation of existing ferroelectric memory devices is the relatively small memory cell density compared with other types of memory devices. Planar ferroelectric memory cells can be scaled to smaller sizes by improving process technology, circuit design, programming algorithm, and fabrication process. However, as feature sizes of the ferroelectric memory cells approach a lower limit, planar process and fabrication techniques become challenging and costly. As a result, memory density for planar ferroelectric memory devices approaches an upper limit.

Various embodiments in accordance with the present disclosure provide 3D ferroelectric memory architectures that can address the density limitation in the planar ferroelectric memory devices, thereby achieving gains in performance and area ratio and reduction in cost-per-byte for storage.

FIG. 1A illustrates a plan view of an exemplary 3D ferroelectric memory device 100, according to some embodiments of the present disclosure. As shown in FIG. 1A, 3D ferroelectric memory device 100 can include an array of ferroelectric memory cells 102 and a plurality of slit structures 104. Each ferroelectric memory cell 102 can be in a substantially circular shape in the plan view. It is understood that the shape of ferroelectric memory cell 102 in the plan view is not limited to circular and can be any other shapes, such as rectangular, square, oval, etc. Slit structures 104 can divide 3D ferroelectric memory device 100 into multiple regions, such as memory blocks and/or multiple memory fingers, each of which includes multiple ferroelectric memory cells 102. It is noted that x and y axes are included in FIG. 1A to further illustrate the spatial relationship of the components in 3D ferroelectric memory device 100. It is noted that x and y axes define a lateral plane of 3D ferroelectric memory device 100, in which slit structures 104 extend along the x-direction. In some embodiments, the word lines of 3D ferroelectric memory device 100 also extend along the x-direction, and the bit lines of 3D ferroelectric memory device 100 extend along the y-direction, which is perpendicular to the x-direction. The same notion for describing spatial relationship is applied throughout the present disclosure. In some embodiments, the bit line extending direction and the word line extending direction are not perpendicular to each other.

Figure 1B:
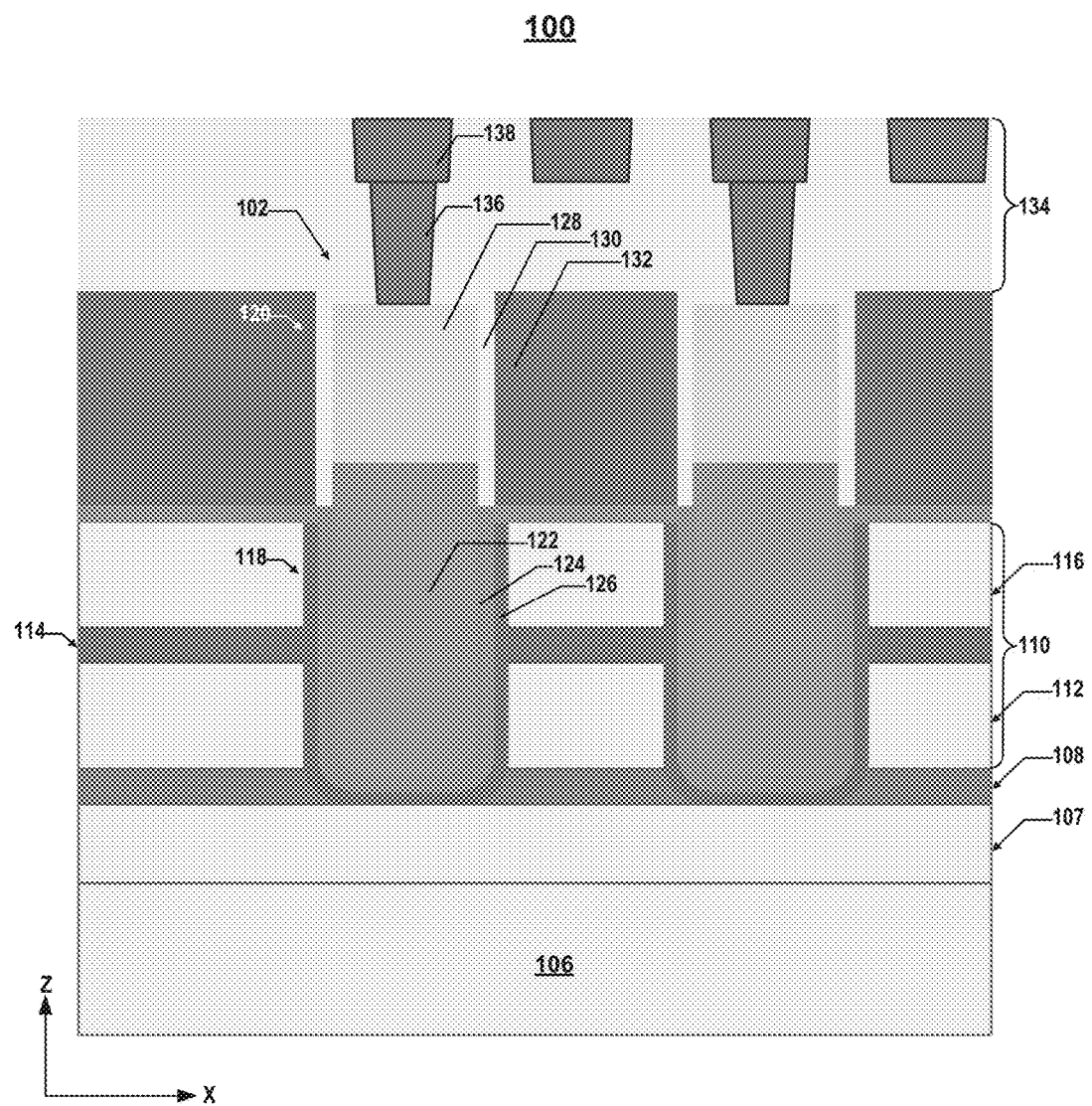
FIG. 1B illustrates a cross-section of an exemplary 3D ferroelectric memory device in FIG. 1A, according to some embodiments of the present disclosure.

FIG. 1B illustrates a cross-section of 3D ferroelectric memory device 100 in FIG. 1A along the x-direction, according to some embodiments of the present disclosure. As shown in FIG. 1B, 3D ferroelectric memory device 100 can include a substrate 106, which can include silicon (e.g., single crystalline silicon), silicon germanium (SiGe), gallium arsenide (GaAs), germanium (Ge), silicon on insulator (SOI), germanium on insulator (GOI), or any other suitable materials.

In some embodiments, one or more peripheral devices (not shown) are formed on and/or in substrate 106. The peripheral devices can include any suitable digital, analog, and/or mixed-signal peripheral circuits used for facilitating the operation of 3D ferroelectric memory device 100. For example, the peripheral devices can include one or more of a data buffer, a decoder (e.g., a row decoder and a column decoder), a sense amplifier, a driver, a charge pump, a current or voltage reference, or any active or passive components of the circuits (e.g., transistors, diodes, resistors, or capacitors).

As shown in FIG. 1B, 3D ferroelectric memory device 100 can include an interconnect layer 107 (referred to herein as a "peripheral interconnect layer") above the peripheral devices to transfer electrical signals to and from the peripheral devices. It is noted that x and z axes added included in FIG. 1B to further illustrate the spatial relationship of the components in 3D ferroelectric memory device 100. Substrate 106 includes two lateral surfaces (e.g., a top surface and a bottom surface) extending laterally in the x-direction (i.e., one of the lateral directions). As used herein, whether one component (e.g., a layer or a device) is "on," "above," or "below" another component (e.g., a layer or a device) of a semiconductor device (e.g., 3D ferroelectric memory device 100) is determined relative to the substrate of the semiconductor device (e.g., substrate 106) in the z-direction (i.e., the vertical direction) when the substrate is positioned in the lowest plane of the semiconductor device in the z-direction. The same notion for describing spatial relationship is applied throughout the present disclosure.

Peripheral interconnect layer 107 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Peripheral interconnect layer 107 can further include one or more interlayer dielectric (ILD) layers (also known as "intermetal dielectric (IMD) layers") in which the interconnect lines and the via contacts can form. That is, peripheral interconnect layer 107 can include interconnect lines and via contacts in one or more ILD layers. The interconnect lines and via contacts in peripheral interconnect layer 107 can include conductive materials including, but not limited to, tungsten (W), cobalt (Co), copper (Cu), aluminum (Al), silicides, doped silicon, TCOs, or any combination thereof. The ILD layers in peripheral interconnect layer 107 can include dielectric materials including, but not limited to, silicon oxide, silicon nitride, silicon oxynitride, low dielectric constant (low-k) dielectrics, or any combination thereof.

As shown in FIG. 1B, 3D ferroelectric memory device 100 can include a stop layer 108 above peripheral interconnect layer 107 and a capacitor gate stack 110 above stop layer 108. In some embodiments, stop layer 108 is arranged at the array to help stop an etch process during the formation of ferroelectric memory cells 102 in the array (as shown in the plan view of FIG. 1A). In some embodiments, stop layer 108 is removed at the periphery or edge of array of ferroelectric memory cells 102 (as shown in the plan view of FIG. 1A) for landing the bit lines and the contacts to the peripheral devices underneath ferroelectric memory cells 102. As shown in FIG. 1B, stop layer 108 can define the bottom position of ferroelectric memory cell 102 at least partially extending vertically through capacitor gate stack 110.

In some embodiments, capacitor gate stack 110 includes a first dielectric layer 112, a conductor layer 114, and a second dielectric layer 116 disposed bottom up in this order. That is, conductor layer 114 can be formed vertically between first dielectric layer 112 and second dielectric layer 116, which are disposed below and above conductor layer 114, respectively. Conductor layer 114 can include conductive materials including, but not limited to, W, Co, Cu, Al, silicides, doped silicon, TCOs, or any combination thereof. First and second dielectric layers 112 and 116 can be formed with dielectric materials including, but not limited to, silicon oxide, silicon nitride, silicon oxynitride, low-k dielectrics, or any combination thereof. Stop layer 108 can include a dielectric material that is different from the dielectric materials used in first dielectric layer 112 including, but not limited to, high dielectric constant (high-k) dielectrics, such as aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof.

As shown in FIG. 1B, 3D ferroelectric memory device 100 can include array of ferroelectric memory cells 102 each extending vertically above the peripheral devices on substrate 106. In some embodiments, ferroelectric memory cell 102 is a "1T-1C" cell that includes a capacitor 118 and a transistor 120 above and electrically connected to capacitor 118. That is, 3D ferroelectric memory device 100 can include a "peripheral-capacitor-transistor" architecture in which the peripheral devices, capacitors 118, and transistors 120 are disposed bottom up in this order. In some embodiments, the 3D ferroelectric memory device 100 can include a "peripheral-transistor-capacitor" architecture in which the peripheral devices, transistors, and capacitors are disposed bottom up in this order. Capacitor 118 of ferroelectric memory cell 102 can extend vertically through capacitor gate stack 110 and be in contact with stop layer 108 at its lower portion.

In some embodiments, capacitor 118 includes a first electrode 122, a second electrode 126, and a ferroelectric layer 124 disposed laterally between first electrode 122 and second electrode 126. Second electrode 126 can be in contact with conductor layer 114 (in capacitor gate stack 110), which can extend laterally and function as a gate line of capacitor 118 of ferroelectric memory cell 102. In some embodiments, each ferroelectric memory cell 102 (and capacitor 118 thereof) can have a substantially cylinder shape (e.g., a pillar shape). First electrode 122, ferroelectric layer 124, and second electrode 126 can be disposed radially from the center of ferroelectric memory cell 102 in this order. It is understood that the shape of ferroelectric memory cell 102 (and capacitor 118 thereof) is not limited to cylinder and can be any other suitable shape, such as trench shape. In some embodiments, ferroelectric layer 124 is a continuous film extending across and shared by multiple capacitors 118.

First electrode 122 and second electrode 126 can include conductive material, including, but not limited to, W, Co, Cu, Al, silicon, TCOs, or any combination thereof. In some embodiments, first electrode 122 includes silicon, such as polysilicon. In some embodiments, second electrode 126 and conductor layer 114 of capacitor 118 include the same conductive material(s), such as W. The materials of first electrode 122 and second electrode 126 can further include, but not limited to, at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), and ruthenium oxide (RuOx). In some embodiments, first electrode 122 and second electrode 126 include the same material(s). In some embodiments, first electrode 122 and second electrode 126 include different materials.

In some embodiments, the first or the second electrode comprises a transparent conductive oxide (TCO). TCOs comprise, but not limited to, doped ZnO based TCOs, doped $TiO_2$ based TCOs, doped $SnO_2$ based TCOs, and perovskite TCOs.

Ferroelectric layer 124 can include a ferroelectric binary composite oxide. In some embodiments, ferroelectric layer 124 includes oxygen and at least one ferroelectric metal. The ferroelectric metal can include, but not limited to, zirconium (Zr), hafnium (Hf), titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb). In some embodiments, ferroelectric layer 124 includes oxygen and two or more ferroelectric metals. The molar ratio between two of the ferroelectric metals can be between 0.1 and 10 (e.g., 0.1, 0.2, 0.3, 0.4, 0.5, 0.6, 0.7, 0.8, 0.9, 1, 2, 3, 4, 5, 6, 7, 8, 9, 10, any range bounded on the lower end by any of these values, or in any range defined by any two of these values). In one example, ferroelectric layer 124 includes ZrHfOx, and the molar ratio between Zr and Hf is 1. In another example, ferroelectric layer 124 includes TiHfOx, and the molar ratio between Ti and Hf is 1. In some embodiments, ferroelectric layer 124 is a composite layer that includes multiple sublayers, at least some of which include ferroelectric metals.

In some embodiments, transistor 120 includes a channel structure 128, a gate conductor 132, and a gate dielectric layer 130 disposed laterally between channel structure 128 and gate conductor 132. Channel structure 128 can include source/drain regions at the lower and upper portions thereof and a channel vertically between the source/drain regions. As shown in FIG. 1B, channel structure 128 can be disposed above and electrically connected to first electrode 122 by its source/drain region at the lower portion. Gate conductor 132 can extend laterally and function as a gate line of transistor 120 as well as a word line of ferroelectric memory cell 102. Gate conductor 132 and gate dielectric layer 130 (e.g., gate oxide) can form a gate stack for controlling electrical properties of the channel in channel structure 128. In some embodiments, each ferroelectric memory cell 102 (and transistor 120 thereof) can have a substantially cylinder shape (e.g., a pillar shape). Channel structure 128, gate dielectric layer 130, and gate conductor 132 can be disposed radially from the center of ferroelectric memory cell 102 in this order. It is understood that the shape of ferroelectric memory cell 102 (and transistor 120 thereof) is not limited to cylinder and can be any other suitable shape, such as trench shape.

In some embodiments, channel structure 128 includes semiconductor materials, such as single crystalline silicon, polysilicon, amorphous silicon, Ge, any other semiconductor materials, or any combinations thereof. The source/drain regions of channel structure 128 can be doped with n-type or p-type dopants at a desired doping level. In some embodiments, gate dielectric layer 130 includes dielectric materials, such as silicon oxide, silicon nitride, or high-k dielectric materials including, but not limited to, $Al_2O_3$, $HfO_2$, $Ta_2O_5$, $ZrO_2$, $TiO_2$, or any combination thereof. In some embodiments, gate conductor 132 includes conductive materials including, but not limited to W, Co, Cu, Al, polysilicon, silicides, or any combination thereof. In some embodiment, a barrier/adhesion layer (not shown) can include one or more layers for increasing the adhesion and/or preventing metal diffusion between gate conductor 132 and gate dielectric layer 130. The materials of the barrier/adhesion layer can include, but are not limited to, titanium (Ti), titanium nitride (TiN), tantalum (Ta), tantalum nitride (TaN), or any combination thereof.

As shown in FIG. 1B, 3D ferroelectric memory device 100 can include an interconnect layer 134 (referred to herein as a "BEOL interconnect layer") above ferroelectric memory cells 102 for transferring electrical signals to and from ferroelectric memory cells 102. BEOL interconnect layer 134 can include local interconnects that are formed in one or more ILD layers and in contact with components in 3D ferroelectric memory device 100, such as the word lines (e.g., gate conductors 132) and ferroelectric memory cells 102. The interconnects are referred to herein as "local interconnects" as they are in contact with the components in 3D ferroelectric memory device 100 directly for fan-out. Each local interconnect can include an opening (e.g., a via hole or a trench) filled with conductive materials including, but not limited to, W, Co, Cu, Al, doped silicon, silicides, TCOs, or any combination thereof. The local interconnects can include bit line contacts 136. In some embodiments, bit line contact 136 is in contact with the source/drain region of transistor 120 at the upper portion of channel structure 128.

BEOL interconnect layer 134 can further include other interconnect lines and via contacts above the local interconnects, such as bit lines 138 formed in one or more ILD layers. In some embodiments, bit line contact 136 is in contact with bit line 138 and electrically connect bit line 138 to transistor 120 of ferroelectric memory cell 102. Bit lines 138 can include conductive materials including, but not limited to, W, Co, Cu, Al, doped silicon, silicides, TCOs, or any combination thereof. The ILD layers can be formed with dielectric materials including, but not limited to, silicon oxide, silicon nitride, silicon oxynitride, low-k dielectrics, or any combination thereof.

Figure 1C:
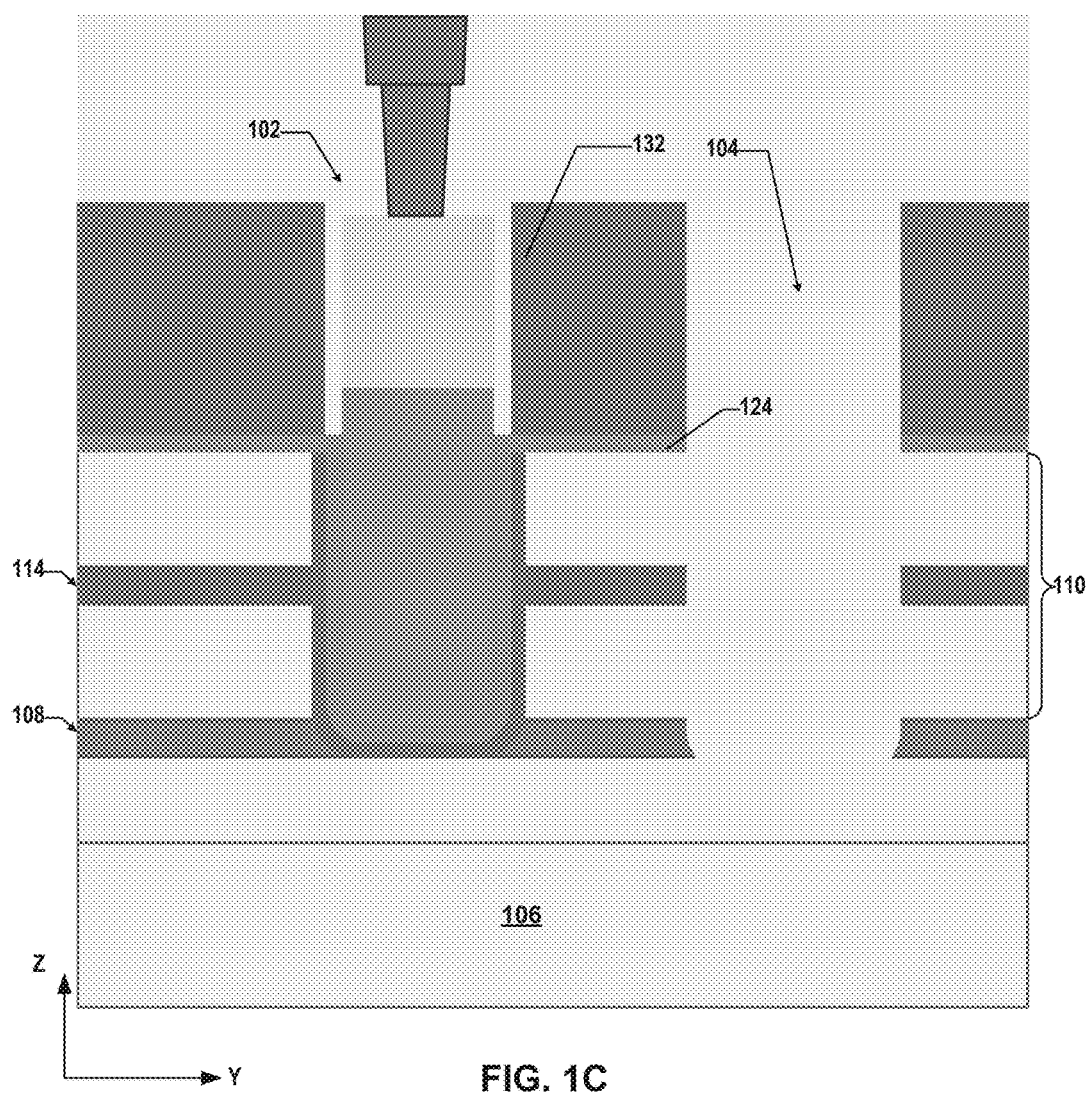
FIG. 1C illustrates another cross-section of an exemplary 3D ferroelectric memory device in FIG. 1A, according to some embodiments of the present disclosure.

FIG. 1C illustrates another cross-section of 3D ferroelectric memory device 100 in FIG. 1A along the y-direction, according to some embodiments of the present disclosure. Different from FIG. 1B, FIG. 1C also shows the cross-section of Slit structure 104. As shown in FIG. 1C, slit structure 104 can be formed through gate conductor 132, ferroelectric layer 124, capacitor gate stack 110, and stop layer 108. Slit structure 104 can be patterned and etched to form a trench by wet etch and/or dry etch. The trench can be filled with dielectric materials including, but not limited to, silicon oxide, silicon nitride, silicon oxynitride, low-k dielectrics, or any combination thereof. As a result, gate lines of capacitor 118 and transistors 120 (e.g., conductor layer 114 and gate conductor 132) extending along the y-direction (e.g., perpendicular to slit structure 104 in the plan view in FIG. 1A) are electrically isolated to form separate memory blocks and/or memory fingers. It is understood that the details of other similar structures (e.g., materials, dimensions, functions, etc.) of 3D ferroelectric memory device 100 (e.g., ferroelectric memory cells 102) in both FIGS. 1B and 1C may not be repeated below.

Figure 1D:
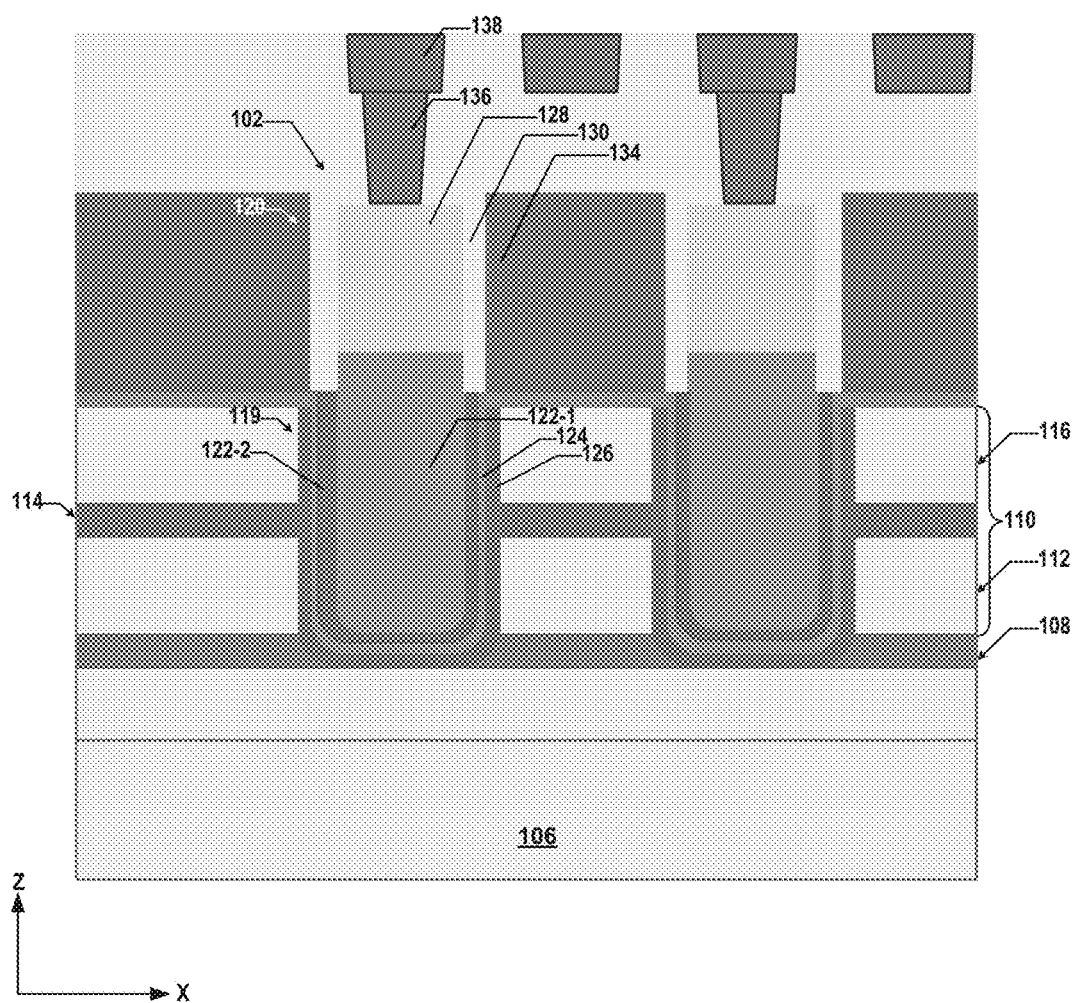
FIG. 1D illustrates a cross-section of another exemplary 3D ferroelectric memory device in FIG. 1A, according to some embodiments of the present disclosure.

FIG. 1D illustrates a cross-section of another 3D ferroelectric memory device 101, according to some embodiments of the present disclosure. Different from 3D ferroelectric memory device 100 shown in FIG. 1B, 3D ferroelectric memory device 101 in FIG. 1D can include a capacitor 119 having a composite first electrode 122 composed of multiple electrodes 122-1 and 122-2. In addition to electrode 122-1 including semiconductor materials (e.g., silicon), composite first electrode 122 can include another electrode 122-2 including conductive materials, including, but not limited to, W, Co, Cu, Al, doped silicon, silicides, TCOs, or any combination thereof. Electrode 122-2 can be disposed laterally (e.g., radially) between electrode 122-1 and ferroelectric layer 124. It is understood that the details of other similar structures (e.g., materials, dimensions, functions, etc.) of 3D ferroelectric memory device 100 (e.g., ferroelectric memory cells 102) in both FIGS. 1B and 1C may not be repeated below.

Figure 1E:
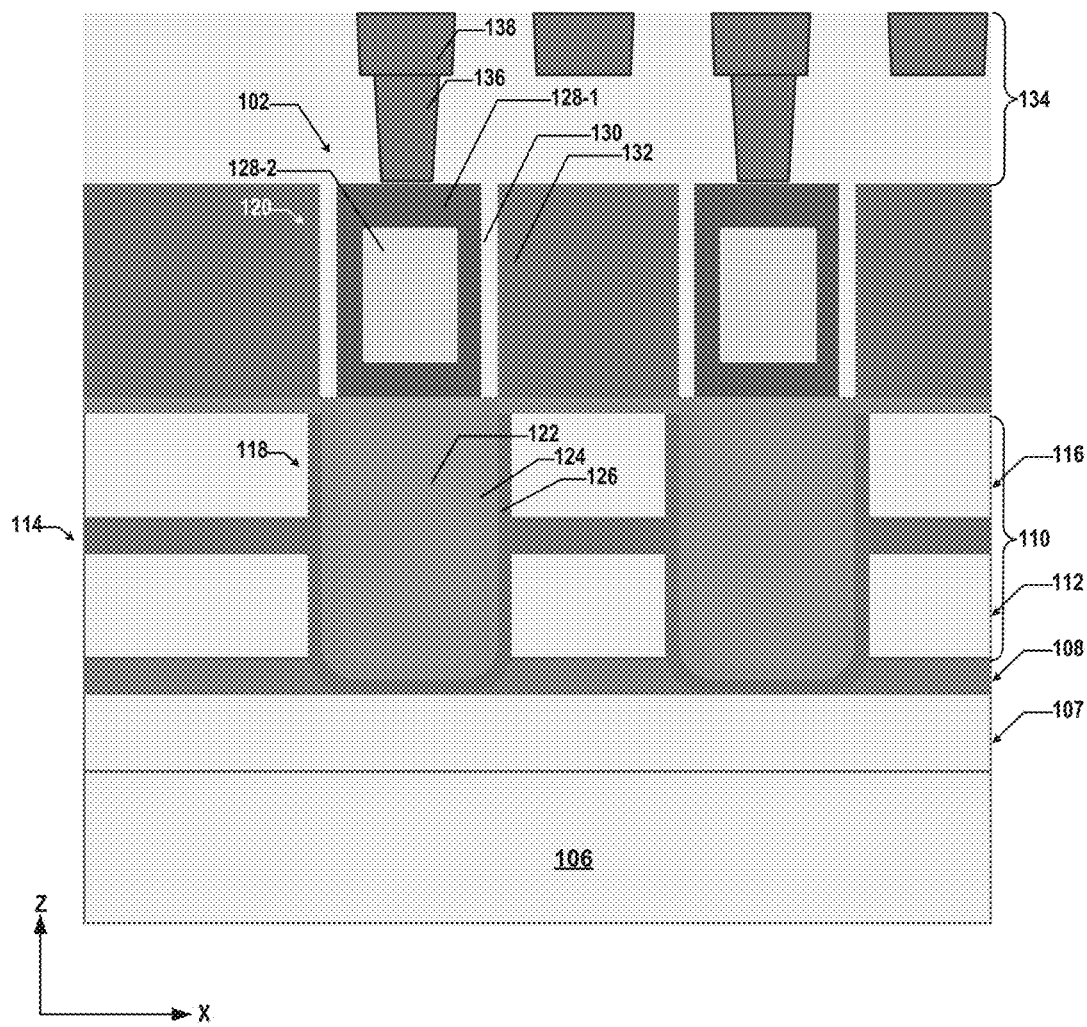
FIG. 1E illustrates a cross-section of still another exemplary 3D ferroelectric memory device in FIG. 1A, according to some embodiments of the present disclosure.

FIG. 1E illustrates a cross-section of still another 3D ferroelectric memory device 103, according to some embodiments of the present disclosure. Different from 3D ferroelectric memory device 100 shown in FIG. 1B, 3D ferroelectric memory device 103 in FIG. 1D can include a hollow channel structure 128 having a hollow channel 128-1 and a hollow core 128-2. Hollow channel 128-1 can be formed to surround hollow core 128-2 in the cross-section view of FIG. 1E, i.e., covering the top and bottom surfaces and sidewalls of hollow core 128-2. In some embodiments, hollow channel 128-1 includes semiconductor materials, such as single crystalline silicon, polysilicon, amorphous silicon, Ge, any other semiconductor materials, or any combinations thereof. In some embodiments, hollow core 128-2 includes dielectric materials, including, but not limited to, silicon oxide, silicon nitride, silicon oxynitride, low-k dielectrics, or any combination thereof. Hollow core 128-2 can be partially or completely filled with air as well. It is understood that the details of other similar structures (e.g., materials, dimensions, functions, etc.) of 3D ferroelectric memory device 100 (e.g., ferroelectric memory cells 102) in both FIGS. 1B and 1C may not be repeated below.

Figure 2:
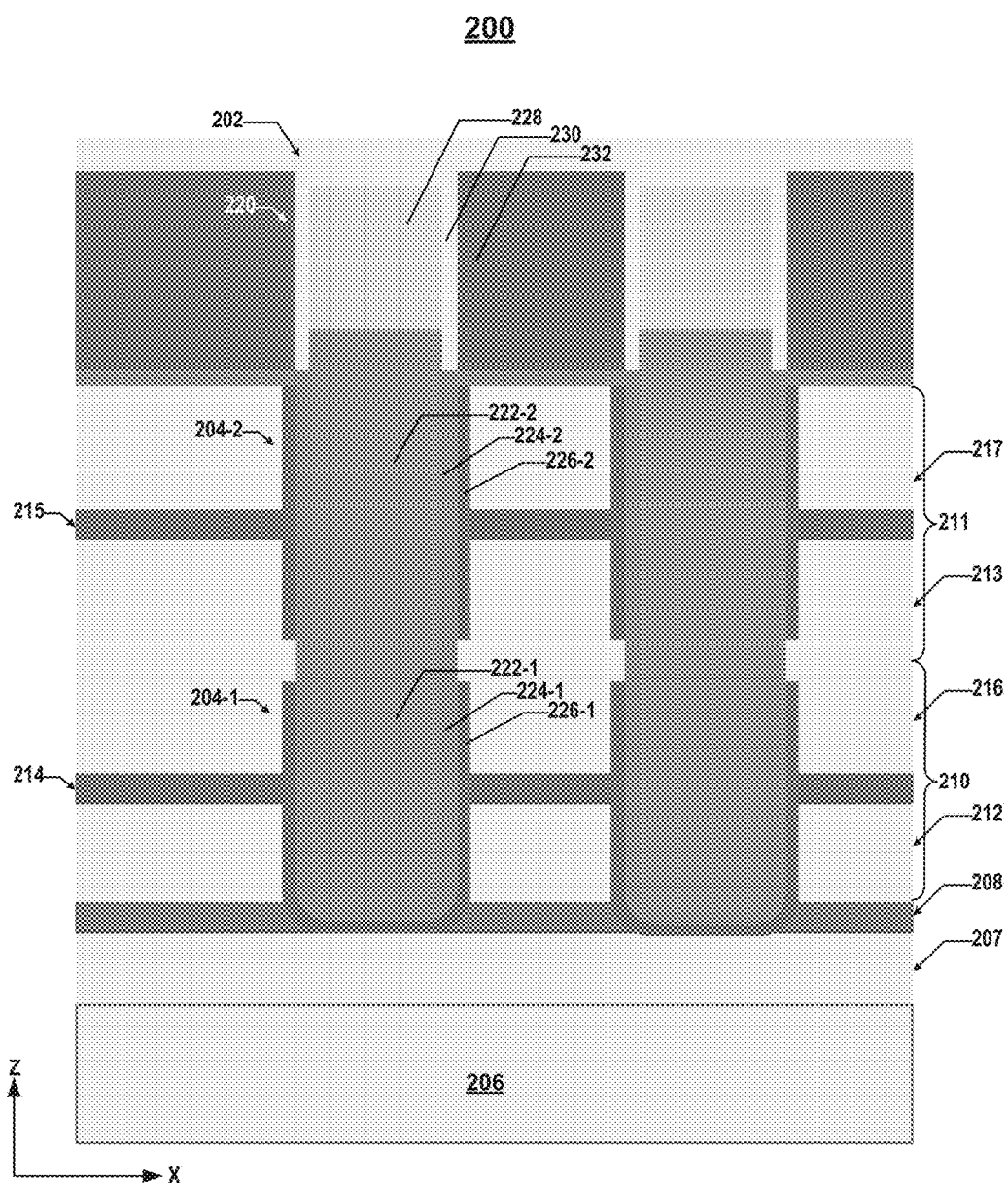
FIG. 2 illustrates a cross-section of another exemplary 3D ferroelectric memory device, according to some embodiments of the present disclosure.

FIG. 2 illustrates a cross-section of another exemplary 3D ferroelectric memory device 200, according to some embodiments of the present disclosure. Different from 3D ferroelectric memory device 100 or 101 shown in FIGS. 1A-1D, 3D ferroelectric memory device 200 in FIG. 2 includes an array of ferroelectric memory cells 202 each including multiple capacitors 204-1 and 204-2 stacked vertically. While each ferroelectric memory cell 102 can be a single-level cell (SLC) capable of storing a single bit of information, ferroelectric memory cells 202 can be a multi-level cell (MLC) capable of storing multiple bits of information in multiple capacitors 204-1 and 204-2. The number of transistors used in each memory cell, however, can be the same for both ferroelectric memory cells 102 and 202. As shown in FIG. 2, ferroelectric memory cell 202 can be a "1T-2C" cell. It is understood that the number of capacitors 204 stacked vertically in ferroelectric memory cell 202 is not limited to 2 and can be 3, 4, or more. For example, ferroelectric memory cell 202 can be a "1T-3C" cell, i.e., triple-level cell (TLC). In some embodiments, multiple transistors can be included in the ferroelectric memory cell 202, to form an "nT-mC" cell, and each of n and m is an integer. In such an "nT-mC" cell, n transistors and m capacitors are included in the cell. It is understood that the details of other similar structures (e.g., materials, dimensions, functions, etc.) of 3D ferroelectric memory devices 100 and 200 in both FIGS. 1B and 2 may not be repeated below.

As shown in FIG. 2, 3D ferroelectric memory device 200 can include a substrate 206, one or more peripheral devices (not shown) formed on and/or in substrate 206 and an interconnect layer 207 (referred to herein as a "peripheral interconnect layer") above the peripheral devices.

As shown in FIG. 2, 3D ferroelectric memory device 200 can also include a stop layer 208 above peripheral interconnect layer 207, a lower capacitor gate stack 210 above stop layer 208 and an upper capacitor gate stack 211 above lower capacitor gate stack 210. Different from 3D ferroelectric memory device 100 including single capacitor gate stack 110, ferroelectric memory device 200 can include two capacitor gate stacks 210 and 211 corresponding to two capacitors 204-1 and 204-2, respectively.

In some embodiments, lower capacitor gate stack 210 includes a first lower dielectric layer 212, a lower conductor layer 214, and a second lower dielectric layer 216 disposed bottom up in this order; upper capacitor gate stack 211 includes a first upper dielectric layer 213, an upper conductor layer 215, and a second upper dielectric layer 217 disposed bottom up in this order. Lower and upper conductor layers 214 and 215 can include conductive materials including, but not limited to, W, Co, Cu, Al, doped silicon, silicides, TCOs, or any combination thereof. Upper and lower dielectric layers 212, 213, 216, and 217 can be formed with dielectric materials including, but not limited to, silicon oxide, silicon nitride, silicon oxynitride, low-k dielectrics, or any combination thereof.

As shown in FIG. 2, 3D ferroelectric memory device 200 can include array of ferroelectric memory cells 202 each extending vertically above the peripheral devices on substrate 206. In some embodiments, ferroelectric memory cell 202 is a "1T-2C" cell that includes lower capacitor 204-1, upper capacitor 204-2, and a transistor 220 above and electrically connected to upper capacitor 204-2 and lower electrode 204-1. That is, 3D ferroelectric memory device 200 can include a "peripheral-capacitor-capacitor-transistor" architecture in which the peripheral devices, lower capacitor 204-1, upper capacitor 204-2, and transistors 220 are disposed bottom up in this order. Lower capacitor 204-1 can extend vertically through lower capacitor gate stack 210 and be in contact with stop layer 208 at its lower portion; upper capacitor 204-2 can extend vertically through upper capacitor gate stack 211 and be in contact with the upper portion of lower capacitor 204-1 at its lower portion. In some embodiments, 3D ferroelectric memory device 200 can include more than two capacitors. In some embodiments, 3D ferroelectric memory device 200 can include more than one transistor. The device 200 can include "n" capacitors and "m" transistors, where n and m are both integers.

In some embodiments, lower capacitor 204-1 includes a first lower electrode 222-1, a second lower electrode 226-1, and a lower ferroelectric layer 224-1 disposed laterally between first lower electrode 222-1 and second lower electrode 226-1. Second lower electrode 226-1 can be in contact with lower conductor layer 214 (in lower capacitor gate stack 210), which can extend laterally and function as a gate line of lower capacitor 204-1. In some embodiments, upper capacitor 204-2 includes a first upper electrode 222-2, a second upper electrode 226-2, and an upper ferroelectric layer 224-2 disposed laterally between first upper electrode 222-2 and second upper electrode 226-2. Second upper electrode 226-2 can be in contact with upper conductor layer 215 (in upper capacitor gate stack 211), which can extend laterally and function as a gate line of upper capacitor 204-2.

In some embodiments, each ferroelectric memory cell 202 (and capacitors 204-1 and 204-2 thereof) can have a substantially cylinder shape (e.g., a pillar shape). First lower electrode 222-1, lower ferroelectric layer 224-1, and second lower electrode 226-1 can be disposed radially from the center of ferroelectric memory cell 202 in this order; first upper electrode 222-2, upper ferroelectric layer 224-2, and second upper electrode 226-2 can be disposed radially from the center of ferroelectric memory cell 202 in this order as well. It is understood that the shape of ferroelectric memory cell 202 (and capacitors 204-1 and 204-2 thereof) is not limited to cylinder and can be any other suitable shape, such as trench shape.

In some embodiments, first lower electrode 222-1 and first upper electrode 222-2 in each ferroelectric memory cell 202 are parts of a continuous electrode extending across and shared by lower and upper capacitors 204-1 and 204-2. Similarly, in some embodiments, lower ferroelectric layer 224-1 and upper ferroelectric layer 224-2 in each ferroelectric memory cell 202 are parts of a continuous ferroelectric layer extending across and shared by lower and upper capacitors 204-1 and 204-2. The continuous ferroelectric layer is a continuous film extending across and shared by multiple ferroelectric memory cells 202, according to some embodiments.

As shown in FIG. 2, second lower electrode 226-1 and second upper electrode 226-2 in each ferroelectric memory cell 202 can be electrically isolated from one another, for example, by a dielectric layer. Each of second lower electrode 226-1 and second upper electrode 226-2 can be electrically connected to lower conductor layer 214 (the gate line of lower capacitor 204-1) and upper conductor layer 215 (the gate line of upper capacitor 204-2), individually and respectively, such that each of lower capacitor 204-1 and upper capacitor 204-2 can be independently controlled to store a bit of information. In some embodiments, a vertical dimension (e.g., in the z-direction) of second lower electrode 226-1 and second upper electrode 226-2 is not the same for generating MLC charge distribution. For example, the vertical direction of second lower electrode 226-1 may be greater than that of second upper electrode 226-2, or vice versa. Thus, the area of second lower electrode 226-1 and second upper electrode 226-2 is also not the same, which can introduce various states of the MLC cell. In one example, if the area of second lower electrode 226-1 is twice of that of second upper electrode 226-2, or vice versa, the MLC cell can have four states: $Q_{L0}+Q_{U0}$, $Q_{L1}+Q_{U0}$, $Q_{L0}+Q_{U1}$, $Q_{L1}+Q_{U1}$, where $Q_{L0}$ and $Q_{L1}$ represent the charge stored in lower capacitor in state 0 and 1, respectively, and $Q_{U0}$ and $Q_{U1}$ represent the charge the charge stored in upper capacitor in state 0 and 1, respectively.

First electrodes 222-1 and 222-2 and second electrodes 226-1 and 226-2 can include conductive material including, but not limited to, W, Co, Cu, Al, silicon, silicides, TCOs, or any combination thereof. In some embodiments, first electrodes 222-1 and 222-2 include silicon, such as polysilicon. In some embodiments, second electrodes 226-1 and 226-2 and conductor layers 214 and 215 include the same conductive material(s), such as W. The materials of first electrodes 222-1 and 222-2 and second electrodes 226-1 and 226-2 can further include, but not limited to, at least one of doped silicon, TCOs, TiN, TiSiNx, TiAlNx, TiCNx, TaNx, TaSiNx, TaAlNx, WNx, WSix, WCNx, Ru, and RuOx. In some embodiments, first electrodes 222-1 and 222-2 and second electrodes 226-1 and 226-2 include the same material(s). In some embodiments, first electrodes 222-1 and 222-2 and second electrodes 226-1 and 226-2 include different materials.

In some embodiments, the first or the second electrode comprises a transparent conductive oxide (TCO). TCOs comprise, but not limited to, doped ZnO based TCOs, doped $TiO_2$ based TCOs, doped $SnO_2$ based TCOs, and perovskite TCOs.

Ferroelectric layers 224-1 and 224-2 can include a ferroelectric binary composite oxide. In some embodiments, ferroelectric layers 224-1 and 224-2 include oxygen and at least one ferroelectric metal, such as Zr, Hr, Ti, Al, Mg, Ca, Sr, Ba, Ra, V, Nb, Ta, Db, La, Ce, Gd, Dy, Er, and Yb. In some embodiments, ferroelectric layers 224-1 and 224-2 include oxygen and two or more ferroelectric metals. The molar ratio between two of the ferroelectric metals can be between 0.1 and 10.

In some embodiments, transistor 220 includes a channel structure 228, a gate conductor 232, and a gate dielectric layer 230 disposed laterally between channel structure 228 and gate conductor 232. Channel structure 228 can include source/drain regions at the lower and upper portions thereof and a channel vertically between the source/drain regions. As shown in FIG. 2, channel structure 228 can be disposed above and electrically connected to the continuous electrode including first electrodes 222-2 and 222-1 by its source/drain region at the lower portion. In some embodiments, channel structure 228 can also be disposed below and electrically connected to the continuous electrode including first electrodes 222-2 and 222-1 by its source/drain region. Gate conductor 232 can extend laterally and function as a gate line of transistor 220 as well as a word line of ferroelectric memory cell 202. Gate conductor 232 and gate dielectric layer 230 (e.g., gate oxide) can form a gate stack for controlling electrical properties of the channel in channel structure 228. In some embodiments, each ferroelectric memory cell 202 (and transistor 220 thereof) can have a substantially cylinder shape (e.g., a pillar shape). Channel structure 228, gate dielectric layer 230, and gate conductor 232 can be disposed radially from the center of ferroelectric memory cell 202 in this order. It is understood that the shape of ferroelectric memory cell 202 (and transistor 220 thereof) is not limited to cylinder and can be any other suitable shape, such as trench shape.

Figure 3:
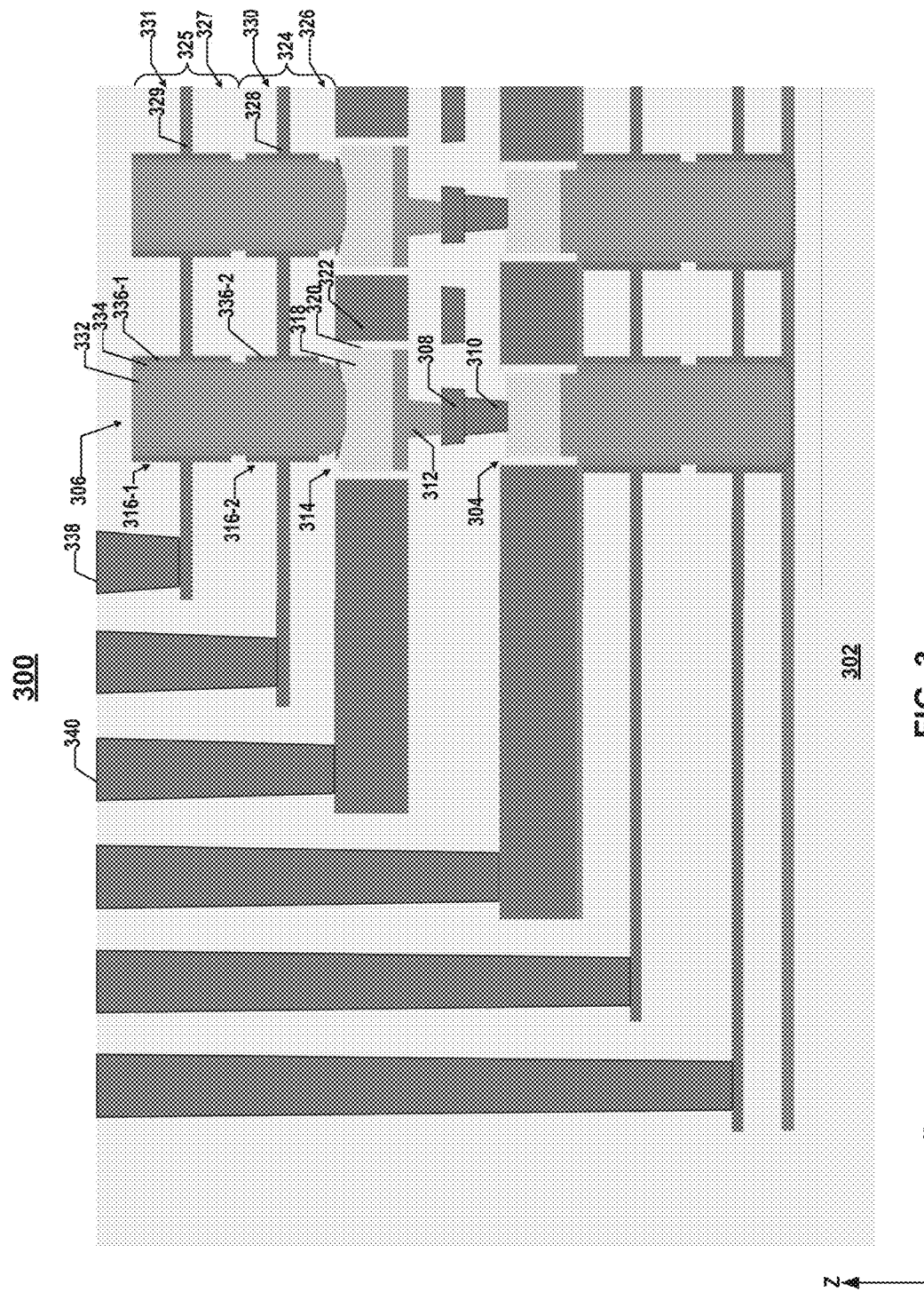
FIG. 3 illustrates a cross-section of still another exemplary 3D ferroelectric memory device, according to some embodiments of the present disclosure.

FIG. 3 illustrates a cross-section of still another exemplary 3D ferroelectric memory device 300, according to some embodiments of the present disclosure. Different from 3D ferroelectric memory device 200 shown in FIG. 2, 3D ferroelectric memory device 300 in FIG. 3 includes multiple arrays of ferroelectric memory cells 304 and 306 disposed in different planes and that share bit lines therebetween vertically. In other words, each bit line can be disposed vertically between and electrically connect a lower ferroelectric memory cell 304 and an upper ferroelectric memory cell 306. Such structure can be repeated laterally (in the x-direction and/or y-direction) and vertically (in the z-direction). It is understood that the details of other similar structures (e.g., materials, dimensions, functions, etc.) of 3D ferroelectric memory devices 200 and 300 in both FIGS. 2 and 3 may not be repeated below.

As shown in FIG. 3, 3D ferroelectric memory device 300 can include array of lower ferroelectric memory cells 304 each extending vertically above a substrate 302. 3D ferroelectric memory device 300 can also include a bit line 308 disposed above lower ferroelectric memory cell 304 and a lower bit line contact 310 in contact with bit line 308 and the source/drain region of the transistor in lower ferroelectric memory cell 304. In some embodiments, 3D ferroelectric memory device 300 further includes an upper bit line contact 312 above bit line 308. Upper bit line contact 312 can include an interconnect line and a via contact including conductive materials including, but not limited to, W, Co, Cu, Al, silicon, silicides, or any combination thereof. In some embodiments, upper bit line contact 312 includes silicon, such as polysilicon. It is understood that although lower ferroelectric memory cell 304 is shown as an MLC cell in FIG. 3, lower ferroelectric memory cell 304 can be a SLC cell (e.g., as described with respect to FIGS. 1B-1D), according to some embodiments.

As shown in FIG. 3, ferroelectric memory device 300 can further include array of upper ferroelectric memory cells 306 each extending vertically above array of lower ferroelectric memory cells 304 and bit lines 308. Upper ferroelectric memory cell 306 can include a transistor 314 and one or more capacitors 316 above and electrically connected to transistor 314. It is understood that although upper ferroelectric memory cell 306 is shown as an MLC cell in FIG. 3, upper ferroelectric memory cell 306 can be a SLC cell (e.g., as described with respect to FIGS. 1B-1D), according to some embodiments.

In some embodiments, transistor 314 includes a channel structure 318, a gate conductor 322, and a gate dielectric layer 320 disposed laterally between channel structure 318 and gate conductor 322. Channel structure 318 can include source/drain regions at the lower and upper portions thereof and a channel vertically between the source/drain regions. As shown in FIG. 3, channel structure 318 can be disposed above and electrically connected to upper bit line contact 312 by its source/drain region at the lower portion. Gate conductor 322 can extend laterally and function as a gate line of transistor 314 as well as a word line of upper ferroelectric memory cell 306. Gate conductor 322 and gate dielectric layer 320 (e.g., gate oxide) can form a gate stack for controlling electrical properties of the channel in channel structure 318. In some embodiments, each upper ferroelectric memory cell 306 (and transistor 314 thereof) can have a substantially cylinder shape (e.g., a pillar shape). Channel structure 318, gate dielectric layer 320, and gate conductor 322 can be disposed radially from the center of upper ferroelectric memory cell 306 in this order. It is understood that the shape of upper ferroelectric memory cell 306 (and transistor 314 thereof) is not limited to cylinder and can be any other suitable shape, such as trench shape.

As shown in FIG. 3, 3D ferroelectric memory device 300 can also include a lower capacitor gate stack 324 above transistor 314 and an upper capacitor gate stack 325 above lower capacitor gate stack 324. In some embodiments, lower capacitor gate stack 324 includes a first lower dielectric layer 326, a lower conductor layer 328, and a second lower dielectric layer 330 disposed bottom up in this order; upper capacitor gate stack 325 includes a first upper dielectric layer 327, an upper conductor layer 329, and a second upper dielectric layer 311 disposed bottom up in this order.

As shown in FIG. 3, each upper ferroelectric memory cell 306 can further include a lower capacitor 316-2 extending vertically through lower capacitor gate stack 324 and an upper capacitor 316-1 extending vertically through upper capacitor gate stack 325. Transistor 314, lower capacitor 316-2, and upper capacitor 316-1 can be stacked up vertically in this order. In some embodiments, lower capacitor 316-2 includes a first electrode 332, a second lower electrode 336-2, and a ferroelectric layer 334 disposed laterally between first electrode 332 and second lower electrode 336-2. Second lower electrode 336-2 can be in contact with lower conductor layer 328 (in lower capacitor gate stack 324), which can extend laterally and function as a gate line of lower capacitor 316-2. In some embodiments, upper capacitor 316-1 includes first electrode 332, a second upper electrode 336-1, and ferroelectric layer 334 disposed laterally between first electrode 332 and second upper electrode 336-1. Second upper electrode 336-1 can be in contact with upper conductor layer 329 (in upper capacitor gate stack 325), which can extend laterally and function as a gate line of upper capacitor 316-1.

In some embodiments, first electrode 332 is a continuous electrode extending across and shared by lower and upper capacitors 316-2 and 316-1. Similarly, in some embodiments, ferroelectric layer 334 is a continuous ferroelectric layer extending across and shared by lower and upper capacitors 316-2 and 316-1. As shown in FIG. 3, at the bottom of lower capacitor 316, the lower portion of first electrode 332 can protrude through ferroelectric layer 334 and be in contact with the source/drain region of channel structure 318 of transistor 314 at its upper portion. Channel structure 318 can be thus below and electrically connected to first electrode 332.

As shown in FIG. 3, second lower electrode 336-2 and second upper electrode 336-1 in each upper ferroelectric memory cell 306 can be electrically isolated from one another, for example, by a dielectric layer. Each of second lower electrode 336-2 and second upper electrode 336-1 can be electrically connected to lower conductor layer 328 (the gate line of lower capacitor 316-2) and upper conductor layer 329 (the gate line of upper capacitor 316-1), individually and respectively, such that each of lower capacitor 316-2 and upper capacitor 316-1 can be independently controlled to store a bit of information.

As shown in FIG. 3, 3D ferroelectric memory device 300 can further include local interconnects, such as gate line contacts 338 and word line contacts 340 for fan-out the gate lines of the capacitors (e.g., conductor layers 328 and 329 of capacitors 316-2 and 316-1) and the word lines (e.g., gate conductor 322 of transistor 314). In some embodiments, 3D ferroelectric memory device 300 includes a core region in which array of ferroelectric memory cells 304 and 306 are formed and staircase regions surrounding the core region. At least some of the local interconnects, such as gate line contacts 338 and word line contacts 340, can land on the gate lines and word lines in the staircase regions. Each of gate line contacts 338 and word line contacts 340 can include an opening (e.g., a via hole or a trench) filled with conductive materials including, but not limited to, W, Co, Cu, Al, doped silicon, silicides, or any combination thereof.

Figure 7:
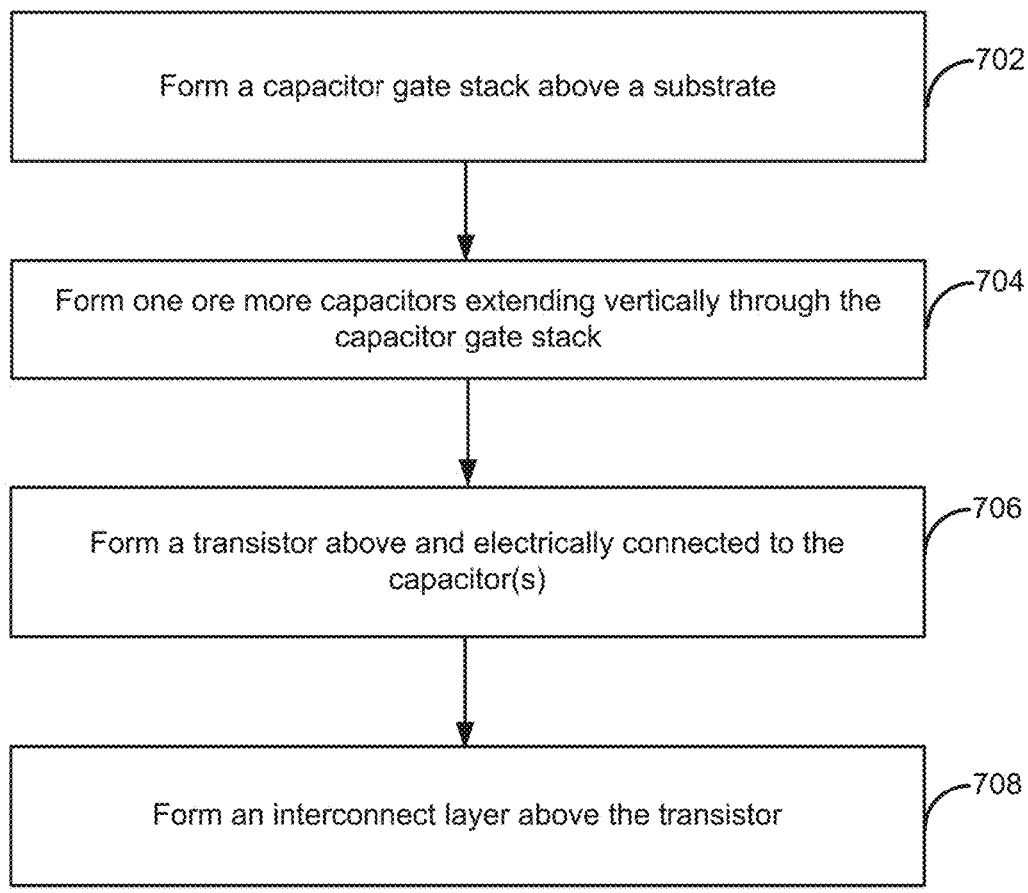
FIG. 7 is a flowchart of an exemplary method for forming a 3D ferroelectric memory device, according to some embodiments of the present disclosure.

FIGS. 4A-4F illustrate an exemplary fabrication process for forming a 3D ferroelectric memory device, according to some embodiments of the present disclosure. FIGS. 5A-5C illustrate another exemplary fabrication process for forming a 3D ferroelectric memory device, according to some embodiments of the present disclosure. FIG. 7 is a flowchart of an exemplary method for forming a 3D ferroelectric memory device, according to some embodiments of the present disclosure. Examples of the 3D ferroelectric memory device depicted in FIGS. 4A-4F, FIGS. 5A-5C, and FIG. 7 include 3D ferroelectric memory devices 100 and 200 depicted in FIGS. 1-2. FIGS. 4A-4F, FIGS. 5A-5C, and FIG. 7 will be described together. It should be understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a capacitor gate stack is formed above a substrate. In some embodiments, prior to forming the capacitor gate stack, a peripheral device is formed on and/or in the substrate, and an interconnect layer (e.g., a peripheral interconnect layer) above the peripheral device. The substrate can be a silicon substrate.

Figure 4A:
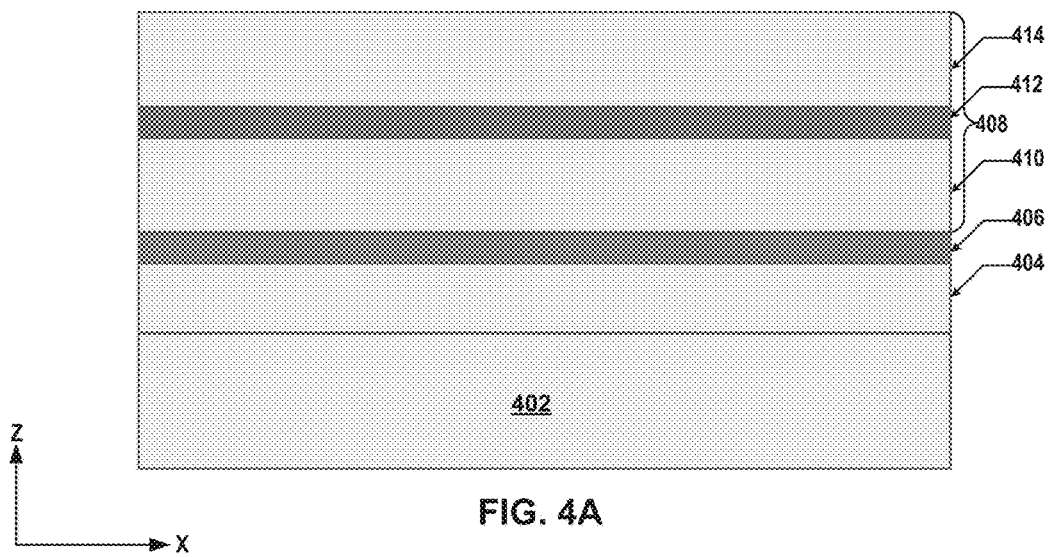
FIGS. 4A-4F illustrate an exemplary fabrication process for forming a 3D ferroelectric memory device, according to some embodiments of the present disclosure.
Figure 5A:
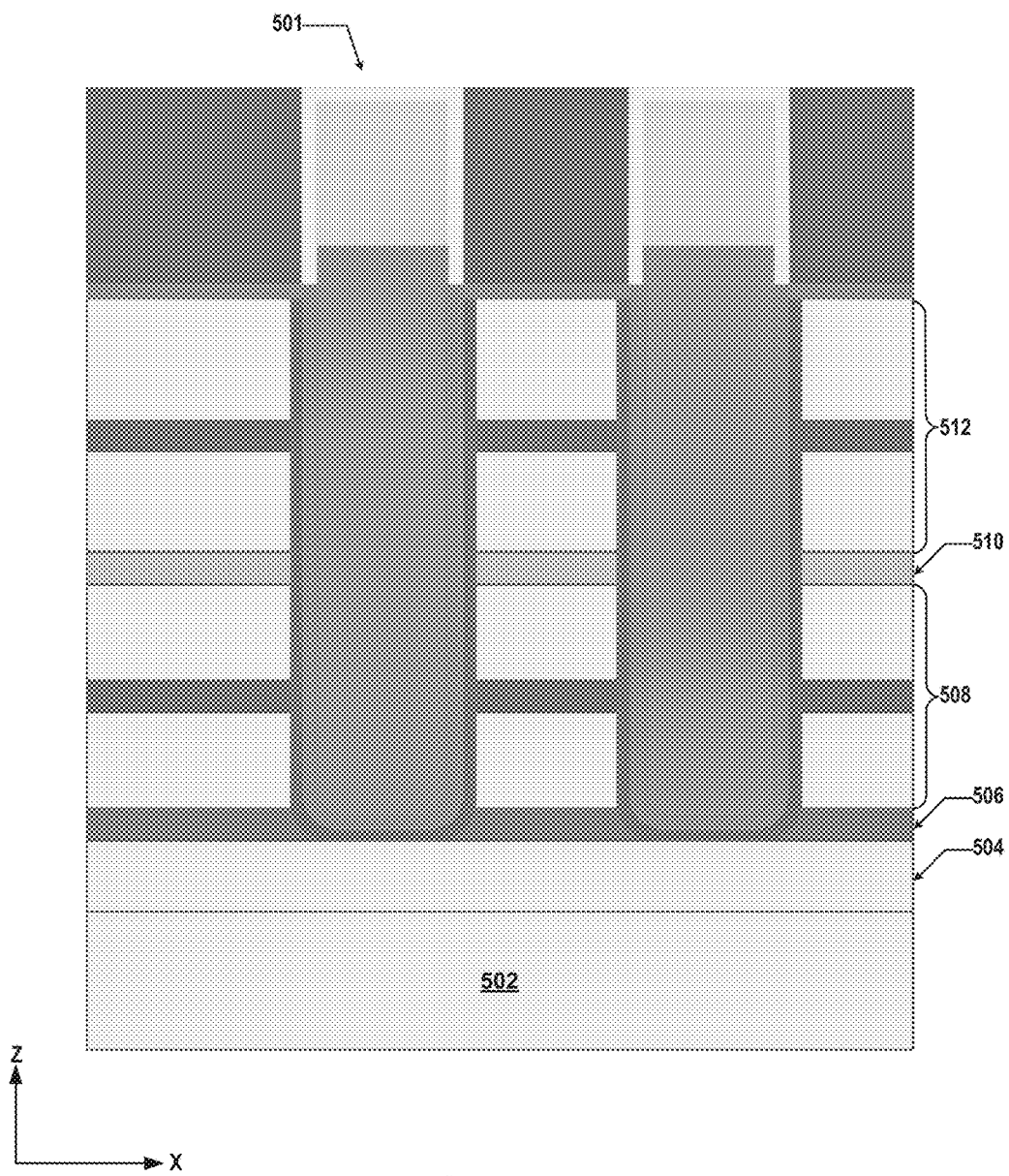
FIGS. 5A-5C illustrate another exemplary fabrication process for forming a 3D ferroelectric memory device, according to some embodiments of the present disclosure.
Figure 5B:
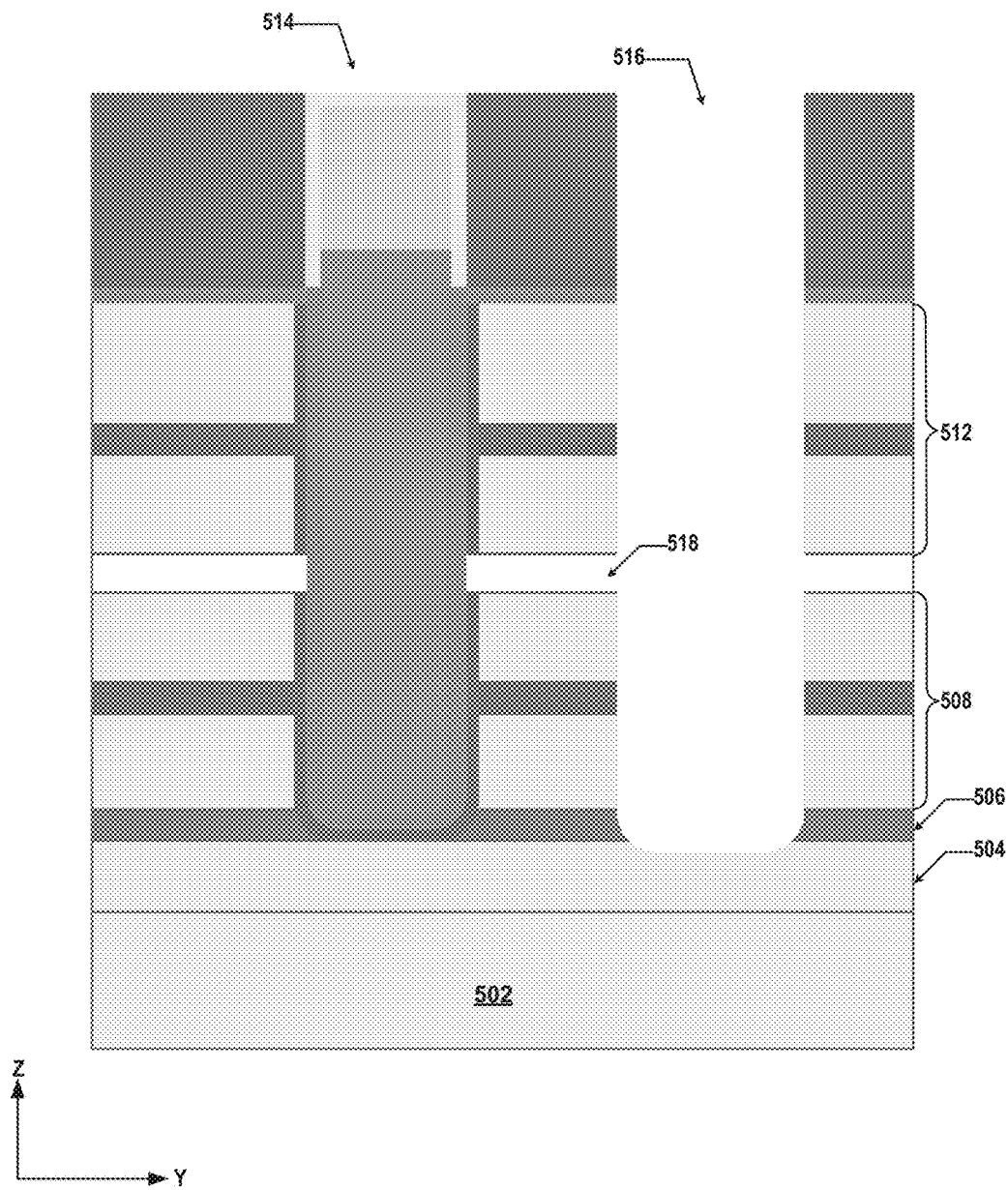
Figure 5C:
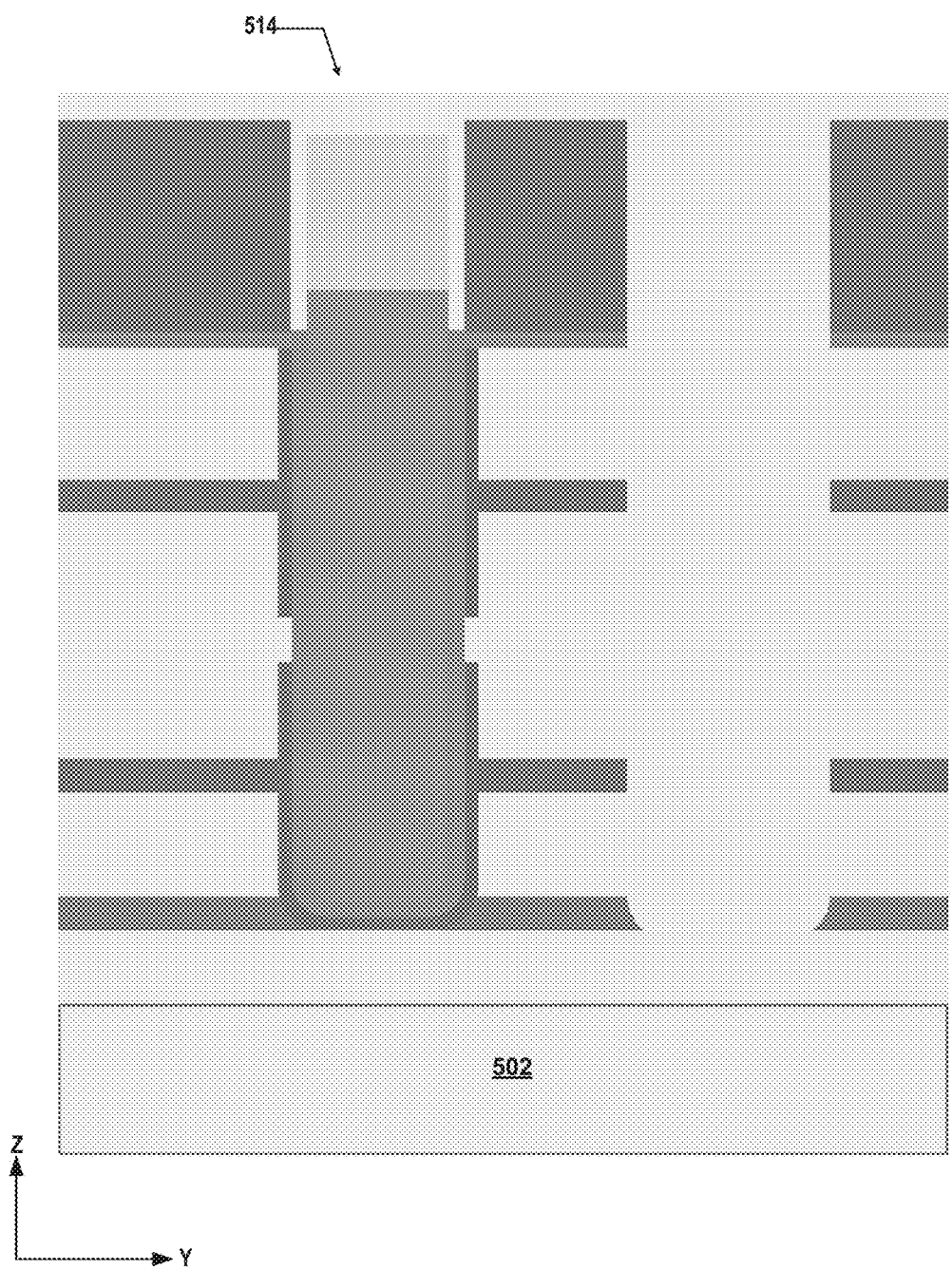

As illustrated in FIG. 4A, a peripheral interconnect layer 404 can be formed on a silicon substrate 402. Peripheral interconnect layer 404 can include interconnects, such as interconnect lines and via contacts of MEOL and/or BEOL, in a plurality of ILD layers. In some embodiments, peripheral interconnect layer 404 includes multiple ILD layers and interconnects therein formed by multiple processes. For example, the interconnects can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof.

In some embodiments, a peripheral device (not shown) is formed in and/or on silicon substrate 402 prior to forming peripheral interconnect layer 404. The peripheral device can include a plurality of transistors formed by a plurality of processes including, but not limited to, photolithography, dry/wet etch, thin film deposition, thermal growth, implantation, CMP, and any other suitable processes. In some embodiments, doped regions (not shown) are formed in silicon substrate 402 by ion implantation and/or thermal diffusion, which function, for example, as source regions and/or drain regions of the transistors. In some embodiments, isolation regions (not shown) are also formed in silicon substrate 402 by wet/dry etch and thin film deposition.

As illustrated in FIG. 4A, a stop layer 406 can be formed above peripheral interconnect layer 404. Stop layer 406 can include dielectric materials including, but not limited to, high-k dielectrics, such $Al_2O_3$, $HfO_2$, $Ta_2O_5$, $ZrO_2$, $TiO_2$, or any combination thereof. Stop layer 406 can be formed by one or more thin film deposition processes including, but not limited to, CVD, PVD, ALD, or any combination thereof. In some embodiments, stop layer 406 is patterned by photolithography and wet/dry etch to be formed at the periphery or edge of the ferroelectric memory cell array for landing the bit lines and the contacts to the peripheral devices.

As illustrated in FIG. 4A, a capacitor gate stack 408 can be formed above stop layer 406. In some embodiments, a first dielectric layer 410 is first formed on stop layer 406. First dielectric layer 410 can include a dielectric material that is different from the dielectric materials used in stop layer 406, including, but not limited to, silicon oxide, silicon nitride, silicon oxynitride, low-k dielectrics, or any combination thereof. In some embodiments, a conductor layer 412 is then formed on first dielectric layer 410, include conductive materials such as W, Co, Cu, Al, doped silicon, silicides, TCOs, or any combination thereof. In some embodiments, a second dielectric layer 414 is then formed on conductor layer 412. Second dielectric layer 414 can include a dielectric material that is the same as that of first dielectric layer 410, including, but not limited to, silicon oxide, silicon nitride, silicon oxynitride, low-k dielectrics, or any combination thereof. First and second dielectric layers 410 and 414 and conductor layer 412 can be formed by one or more thin film deposition processes including, but not limited to, CVD, PVD, ALD, electrochemical depositions, or any combination thereof.

Method 700 proceeds to operation 704, as illustrated in FIG. 7, in which one or more capacitors extending vertically through the capacitor gate stack are formed. In some embodiments, the capacitor gate stack includes multiple capacitor gate stacks, and multiple capacitors are formed such that each of the capacitors extends vertically through a respective capacitor gate stack. Forming a capacitor can include etching an opening through the capacitor gate stack until the stop layer, forming a second electrode in the opening, forming a ferroelectric layer in contact with the second electrode, and forming a first electrode in contact with the ferroelectric layer.

Figure 4B:
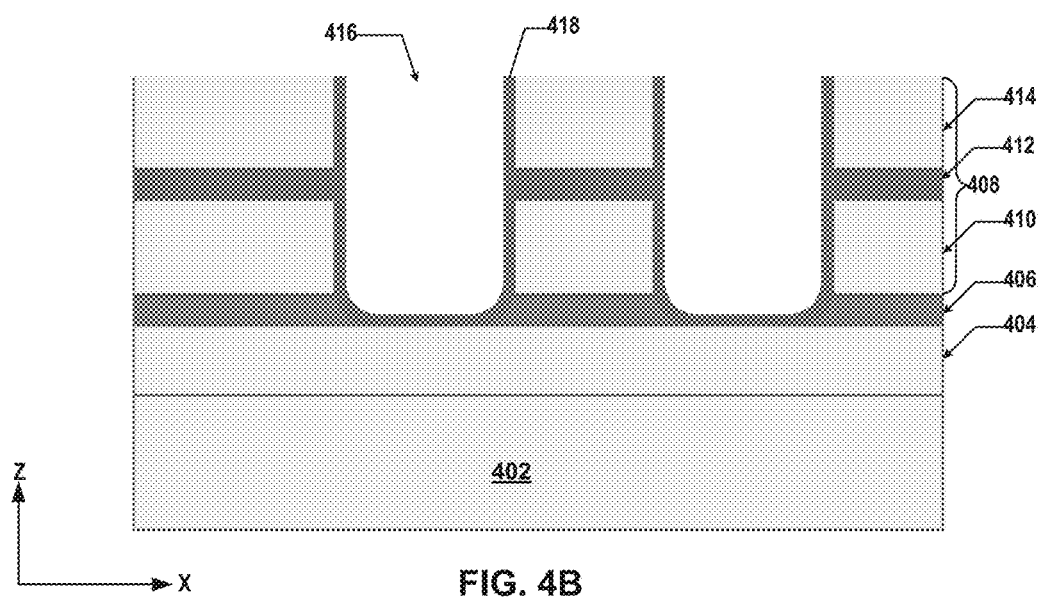

As illustrated in FIG. 4B, an opening 416 can be etched through capacitor gate stack 408 (including first and second dielectric layers 410 and 414 and conductor layer 412) until stop layer 406. Opening 416 can be formed by wet etching and/or dry etching of dielectric materials (e.g., silicon oxide and silicon nitride) and conductive materials (e.g., W), which is stopped at stop layer 406. Etching of capacitor gate stack 408 to form opening 416 can be controlled by etch stop at a different material. For example, stop layer 406 including $Al_2O_3$ can prevent further etching into peripheral interconnect layer 404.

A second electrode 418 can be formed by depositing a conductive film (e.g., a metal film) on the sidewalls and bottom surface of opening 416 using one or more thin film deposition processes including, but not limited to, CVD, PVD, ALD, electrochemical depositions, or any combination thereof. The resulting conductive film of second electrode 418 can be electrically connected to conductor layer 412 in capacitor gate stack 408. In some embodiments, second electrode 418 is not formed on the top surface of capacitor gate stack 408. Any part of conductive film formed on the top surface of capacitor gate stack 408 can be removed by patterning of a sacrificial/protective layer and etching of the sacrificial/protective layer and the conductive film.

Figure 4C:
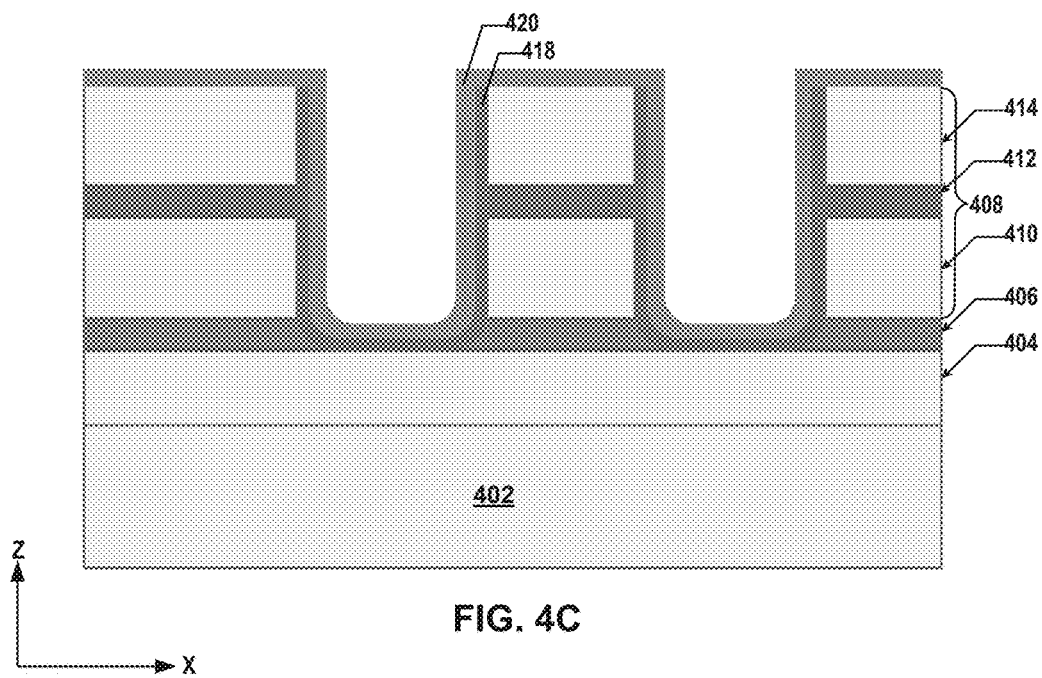

As illustrated in FIG. 4C, a ferroelectric layer 420 can be formed along and in contact with second electrode 418 and on the top surface of capacitor gate stack 408. Ferroelectric layer 420 can cover second electrode 418 formed in opening 416, e.g., on the sidewalls and bottom surface of opening 416. Ferroelectric layer 420 is formed as a continuous film extending across multiple openings 416, according to some embodiments. Ferroelectric layer 420 can include a ferroelectric binary composite oxide film deposited by one or more thin film deposition processes including, but not limited to, CVD, PVD, ALD, electrochemical depositions, or any combination thereof. In some embodiments, ferroelectric layer 420 is formed by sequentially depositing multiple dielectric films of different materials using thin film deposition processes.

Figure 4D:
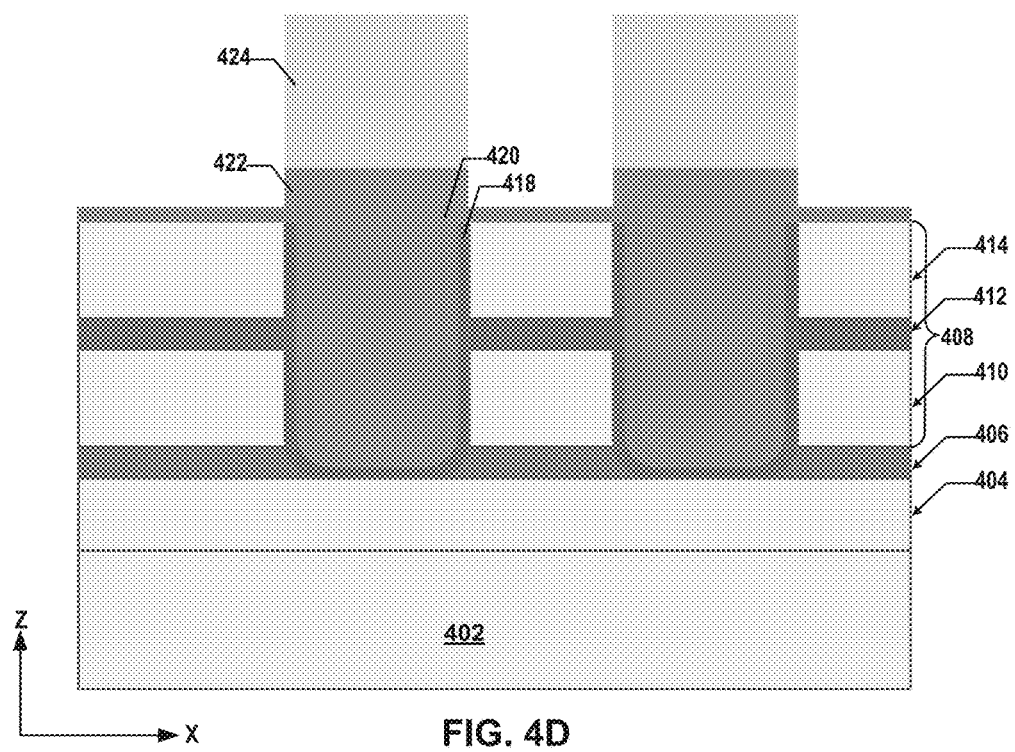

As illustrated in FIG. 4D, a first electrode 422 can be formed to fill the remaining space in opening 416 and in contact with ferroelectric layer 420. In some embodiments, a semiconductor film (e.g., silicon film) is first deposited to fill the remaining space in opening 416 and cover ferroelectric layer 420 both inside opening 416 and outside opening 416 (i.e., at the field regions) using one or more thin film deposition processes including, but not limited to, CVD, PVD, ALD, electrochemical depositions, or any combination thereof. The semiconductor film is then patterned and etched, such as by wet/dry etching and/or CMP, to remove at least part outside opening 416 (i.e., at the field regions) to form first electrode 422 as shown in FIG. 4D. In some embodiments, first electrode 422 is a composite electrode including a conductive layer (e.g., a metal film) formed in contact with ferroelectric layer 420 inside opening 416 prior to forming the semiconductor film that fills the remaining space in opening 416.

Method 700 proceeds to operation 706, as illustrated in FIG. 7, in which a transistor is formed above and electrically connected to the one or more capacitors. Forming the transistor can include forming a channel structure above and electrically connected to the first electrode, forming a gate dielectric layer in contact with the channel structure, and forming a gate conductor in contact with the gate dielectric layer.

As illustrated in FIG. 4D, a channel structure 424 can be formed above and aligned with first electrode 422. In some embodiments, a silicon film is first formed on the semiconductor film forming first electrode 422. The silicon film can include polysilicon or amorphous silicon deposited using one or more thin film deposition processes including, but not limited to, CVD, PVD, ALD, or any combination thereof. Alternatively, the silicon film can include single crystalline silicon bonded to the semiconductor film forming first electrode 422 (e.g., forming silicon-silicon covalent bonding). In some embodiments, the bonding of single crystalline silicon to first electrode 422 is followed by thinning the bonded single crystalline silicon. In some embodiments, the silicon film is then patterned and etched, such as by wet/dry etching and/or CMP, to remove at least part outside opening 416 (i.e., at the field regions) to form channel structure 424 as shown in FIG. 4D. In some embodiments, the upper portion and/or the lower portion of channel structure 424 are doped with n-type or p-type dopant to form source/drain regions.

Figure 4E:
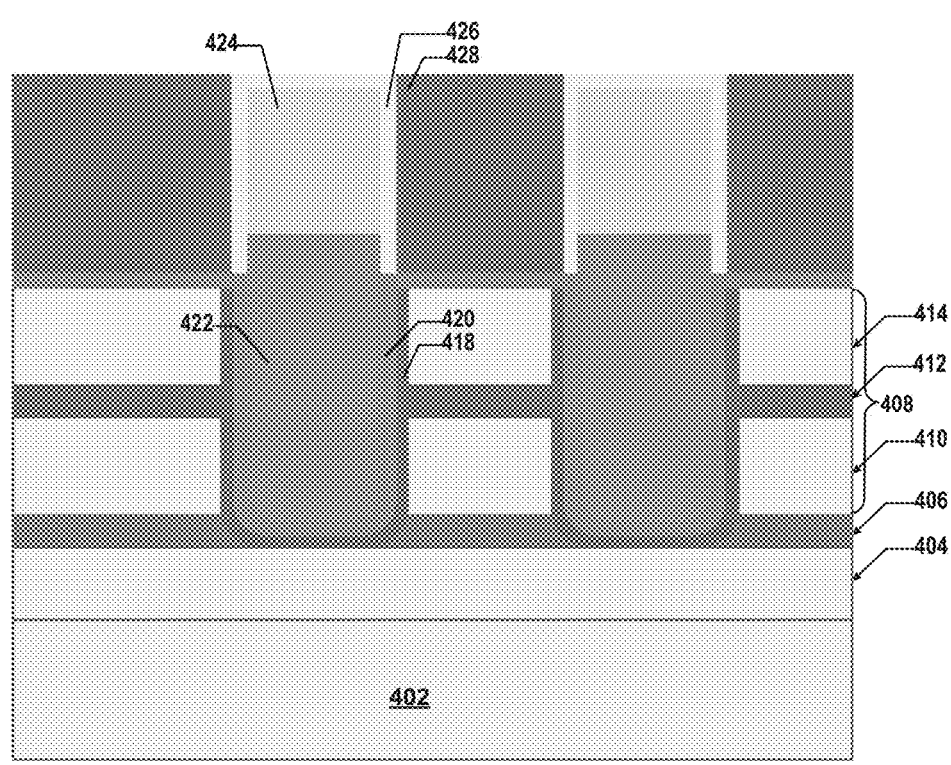

As illustrated in FIG. 4E, a gate dielectric layer 426 can be formed to cover the sidewalls of channel structure 424. In some embodiments, gate dielectric layer 426 also covers the top surface of channel structure 424. In some embodiments, channel structure 424 is first trimmed (e.g., at its sidewalls and top surface) by wet etching and/or dry etching. In some embodiments, gate dielectric layer 426 is then formed by oxidizing part of the sidewalls and top surface of trimmed channel structure 424, for example, by thermal oxidation. Gate conductor 428 can be formed to fill the space between channel structures 424 covered by gate dielectric layer 426 and flush with the top surface of gate dielectric layer 426. In some embodiments, a barrier/adhesion layer (e.g., Ti/TiN) is first formed along the sidewalls of gate dielectric layer 426 using one or more thin film deposition processes including, but not limited to, CVD, PVD, ALD, or any combination thereof. In some embodiments, a conductive film is then deposited on the barrier/adhesion layer using one or more thin film deposition processes including, but not limited to, CVD, PVD, ALD, electrochemical depositions, or any combination thereof, followed by CMP to planarize the deposited conductive film to make it flush with the top surface of gate dielectric layer 426.

Method 700 proceeds to operation 708, as illustrated in FIG. 7, in which an interconnect layer (e.g., a BEOL interconnect layer) above the transistor. Forming the BEOL interconnect layer can include forming a bit line contact above and in contact with the transistor and forming a bit line above and in contact with the bit line contact.

Figure 4F:
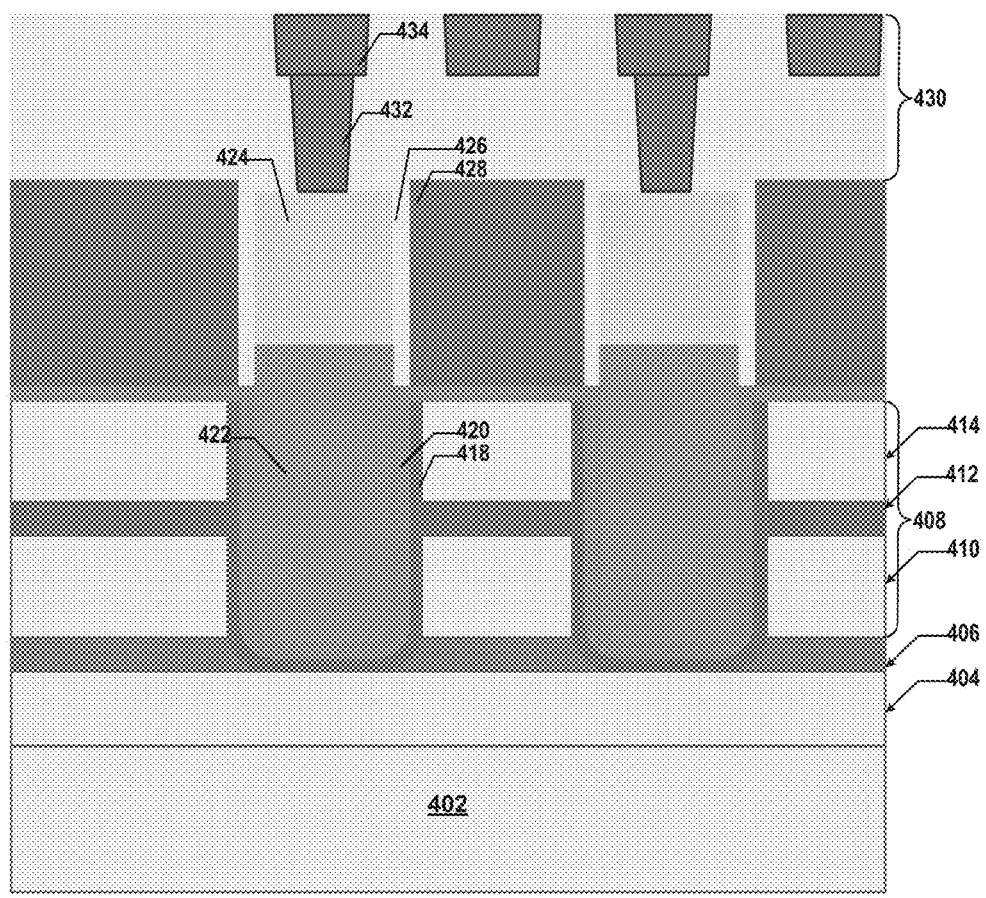

As illustrated in FIG. 4F, a BEOL interconnect layer 430 can be formed above channel structure 424 covered by gate dielectric layer 426. BEOL interconnect layer 430 can include interconnects, such as a bit line contact 432 and a bit line 434 formed in a plurality of ILD layers. In some embodiments, BEOL interconnect layer 430 includes multiple ILD layers and bit line contact 432 and bit line 434 therein formed by multiple processes. For example, bit line contact 432 and bit line 434 can include conductive materials deposited by one or more thin film deposition processes including, but not limited to, CVD, PVD, ALD, electroplating, electroless plating, or any combination thereof. Fabrication processes to form bit line contact 432 and bit line 434 can also include photolithography, CMP, wet/dry etch, or any other suitable processes. The ILD layers can include dielectric materials deposited by one or more thin film deposition processes including, but not limited to, CVD, PVD, ALD, or any combination thereof.

FIGS. 5A-5C illustrate another embodiment of operation 704 in FIG. 7 in which multiple capacitors are formed in an MLC cell. It is understood that the details of other similar operations (e.g., processes, materials, etc.) in both FIGS. 4 and 5 may not be repeated below. As illustrated in FIG. 5A, an MLC ferroelectric memory cell 501 can be formed extending vertically above a silicon substrate 502. A peripheral interconnect layer 504, a stop layer 506, a lower capacitor gate stack 508, a sacrificial layer 510 (e.g., a silicon nitride layer or any dielectrics different from the dielectric layers in capacitor gate stacks 508 and 512), and an upper capacitor gate stack 512 can be sequentially deposited bottom up in this order by one or more thin film deposition processes including, but not limited to, CVD, PVD, ALD, electroplating, electroless plating, or any combination thereof. MLC ferroelectric memory cell 501 can be formed at least partially extending vertically through lower capacitor gate stack 508, sacrificial layer 510, and upper capacitor gate stack 512, stopping at stop layer 506, as described above in detail with respect to FIGS. 4A-4F.

As illustrated in FIG. 5B, a slit 516 can be etched vertically through stop layer 506, lower capacitor gate stack 508, sacrificial layer 510, and upper capacitor gate stack 512. Slit 516 can be formed using wet etching and/or dry etching of dielectric materials (e.g., silicon oxide, silicon nitride, and $Al_2O_3$) and conductive materials (e.g., W). Slit 516 is used as a pathway for removing sacrificial layer 510 performed using wet etching sacrificial layer 510 (e.g., silicon nitride) selective to the dielectric layers (e.g., silicon oxide) in capacitor gate stacks 508 and 512. As a result, lateral recess 518 can be formed, which separates the second electrode into two electrically-isolated lower electrode and upper electrode for the two capacitors, respectively. As illustrated in FIG. 5C, dielectric materials (e.g., silicon oxide) can fill in slit 516 and lateral recess 518 using PVD, CVD, ALD, any other suitable process, or any combination thereof. For example, sacrificial layer 510 (e.g., silicon nitride) can be replaced by silicon oxide. As a result, not only the lower electrode and upper electrode of the second electrode of each MLC ferroelectric memory cell 501 can be electrically isolated, the gate lines of the capacitors and the word line of the transistor can be cut by slit 516 filled with dielectric materials, thereby forming multiple memory blocks and/or memory fingers.

Figure 8:
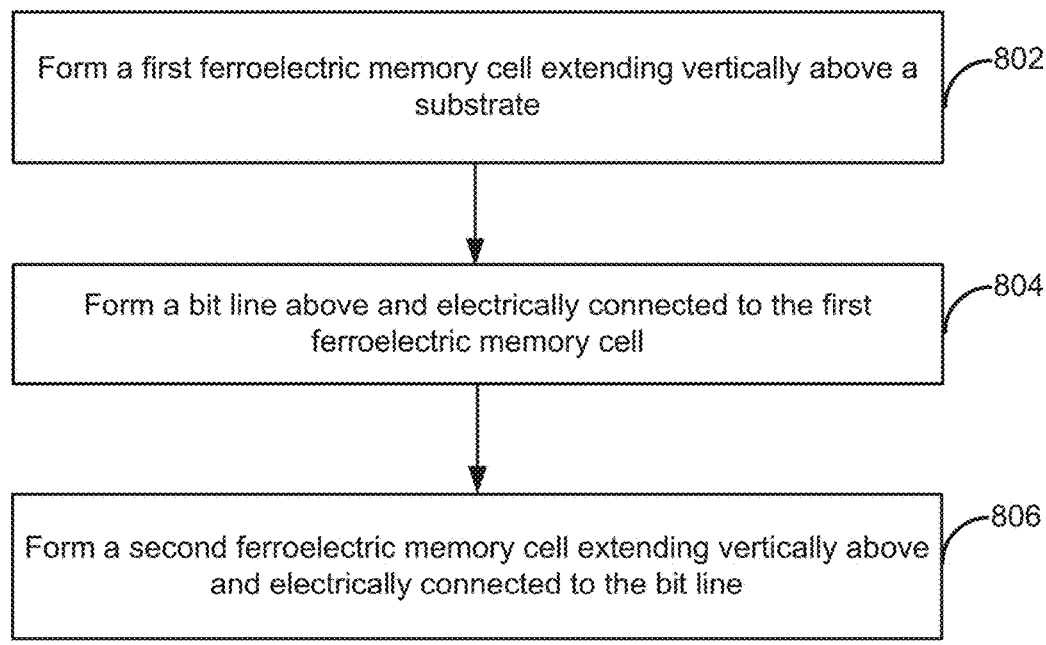
FIG. 8 is a flowchart of another exemplary method for forming a 3D ferroelectric memory device, according to some embodiments of the present disclosure.

FIGS. 6A-6H illustrate still another exemplary fabrication process for forming a 3D ferroelectric memory device, according to some embodiments of the present disclosure. FIG. 8 is a flowchart of another exemplary method for forming a 3D ferroelectric memory device, according to some embodiments of the present disclosure. Examples of the 3D ferroelectric memory device depicted in FIGS. 6A-6H and FIG. 8 include 3D ferroelectric memory device 300 depicted in FIG. 3. FIGS. 6A-6H and FIG. 8 will be described together. It should be understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a first ferroelectric memory cell extending vertically above a substrate is formed. The first ferroelectric memory cell can be formed as described above with respect to FIGS. 4 and 5.

Figure 6A:
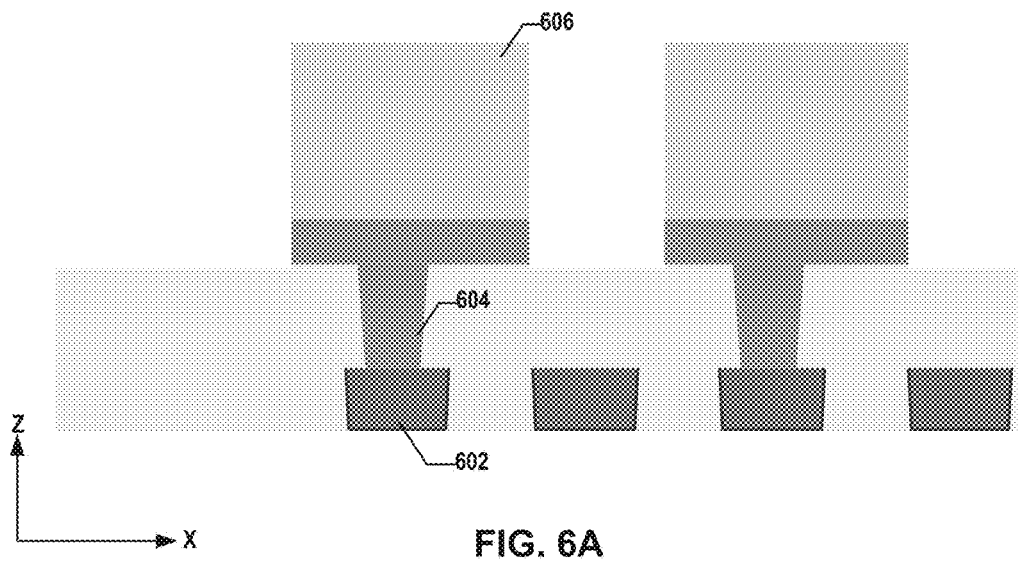
FIGS. 6A-6H illustrate still another exemplary fabrication process for forming a 3D ferroelectric memory device, according to some embodiments of the present disclosure.

Method 800 proceeds to operation 804, as illustrated in FIG. 8, in which a bit line is formed above and electrically connected to the first ferroelectric memory cell. In some embodiments, a lower bit line contact is formed above and electrically connected to the first ferroelectric memory cell prior to forming the bit line, and an upper lower bit line contact is formed above and electrically connected to the bit line after forming the bit line. As illustrated in FIG. 6A, a bit line 602 can be formed in one or more ILD layers as described above with respect to FIG. 4F.

As illustrated in FIG. 6A, an upper bit line contact 604 can be formed above and in contact with bit line 602. Upper bit line contact 604 can include a via contact through the ILD layers and an interconnect line on the top surface of the ILD layers. In some embodiments, a via opening is first etched through the ILD layers to reach bit line 602 by wet etching and/or dry etching. In some embodiments, a conductive film (e.g., a metal film) or a semiconductor film (e.g., a polysilicon film) is deposited inside the via opening and outside the via opening (on the top surface of the ILD layers) using one or more thin film deposition processes including, but not limited to, CVD, PVD, ALD, electrochemical depositions, or any combination thereof. In some embodiments, the conductive or semiconductor film is then patterned and etched, such as by wet/dry etching and/or CMP, to remove at least part outside the via opening to form upper bit line contact 604 as shown in FIG. 6A.

Method 800 proceeds to operation 806, as illustrated in FIG. 8, in which a second ferroelectric memory cell extending vertically above and electrically connected to the bit line is formed. As illustrated in FIG. 6A, a channel structure 606 can be formed above and aligned with upper bit line contact 604. In some embodiments, a silicon film is first formed on the conductive or semiconductor film forming upper bit line contact 604. The silicon film can include polysilicon or amorphous silicon deposited using one or more thin film deposition processes including, but not limited to, CVD, PVD, ALD, or any combination thereof. Alternatively, the silicon film can include single crystalline silicon bonded to the semiconductor film forming upper bit line contact 604 (e.g., forming silicon-silicon covalent bonding), followed by thinning the bonded single crystalline silicon. In some embodiments, the silicon film is then patterned and etched, such as by wet/dry etching and/or CMP, to remove at least part outside the via opening to form channel structure 606 as shown in FIG. 6A. In some embodiments, the upper portion and/or the lower portion of channel structure 606 are doped with n-type or p-type dopant to form source/drain regions.

Figure 6B:
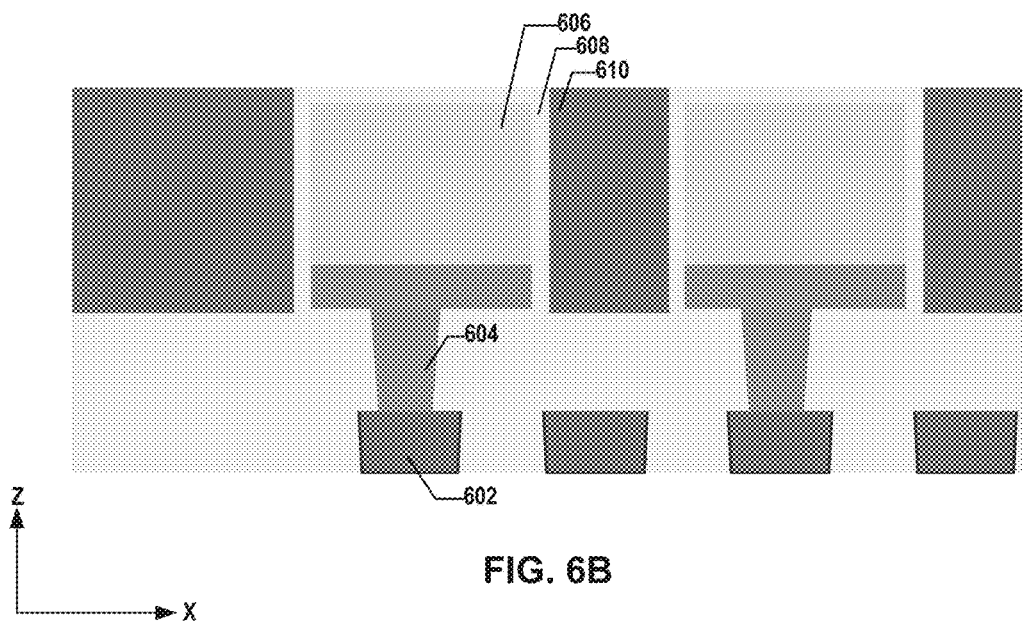

As illustrated in FIG. 6B, a gate dielectric layer 608 can be formed to cover the sidewalls and top surface of channel structure 606. In some embodiments, channel structure 606 is first trimmed (e.g., at its sidewalls and top surface) by wet etching and/or dry etching. In some embodiments, gate dielectric layer 608 is then formed by oxidizing part of the sidewalls and top surface of trimmed channel structure 606, for example, by thermal oxidation. Gate conductor 610 can be formed to fill the space between channel structures 606 covered by gate dielectric layer 608 and flush with the top surface of gate dielectric layer 608. In some embodiments, a barrier/adhesion layer (e.g., Ti/TiN) is first formed along the sidewalls of gate dielectric layer 608 using one or more thin film deposition processes including, but not limited to, CVD, PVD, ALD, or any combination thereof. In some embodiments, a conductive film is then deposited on the barrier/adhesion layer using one or more thin film deposition processes including, but not limited to, CVD, PVD, ALD, electrochemical depositions, or any combination thereof, followed by CMP to planarize the deposited conductive film to make it flush with the top surface of gate dielectric layer 608.

Figure 6C:
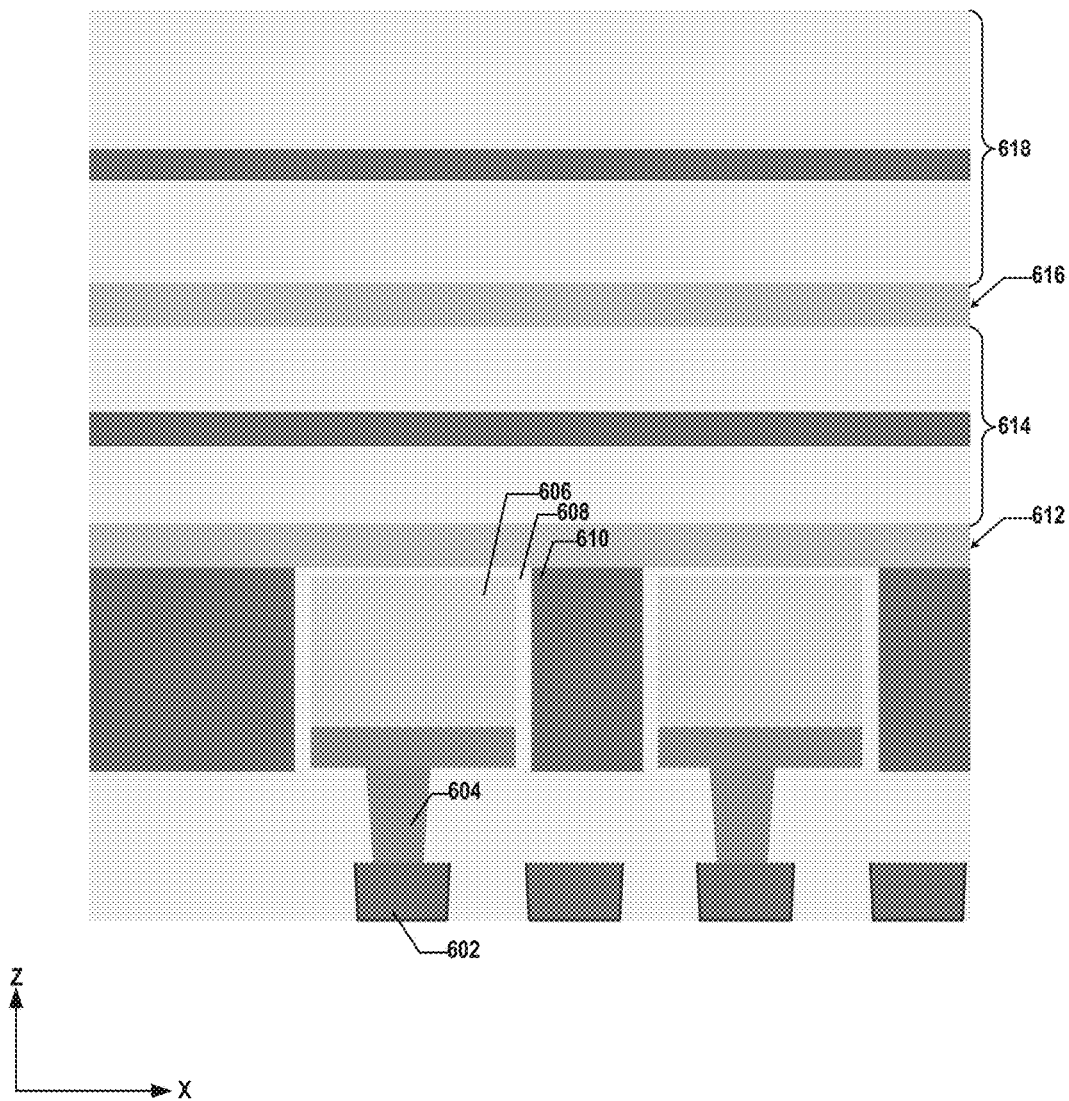

As illustrated in FIG. 6C, a separation layer 612 (e.g., a silicon nitride layer), a lower capacitor gate stack 614, a sacrificial layer 616 (e.g., a silicon nitride layer or any dielectrics different from the dielectric layers in capacitor gate stacks 614 and 618), and an upper capacitor gate stack 618 can be sequentially deposited bottom up in this order by one or more thin film deposition processes including, but not limited to, CVD, PVD, ALD, electroplating, electroless plating, or any combination thereof.

Figure 6D:
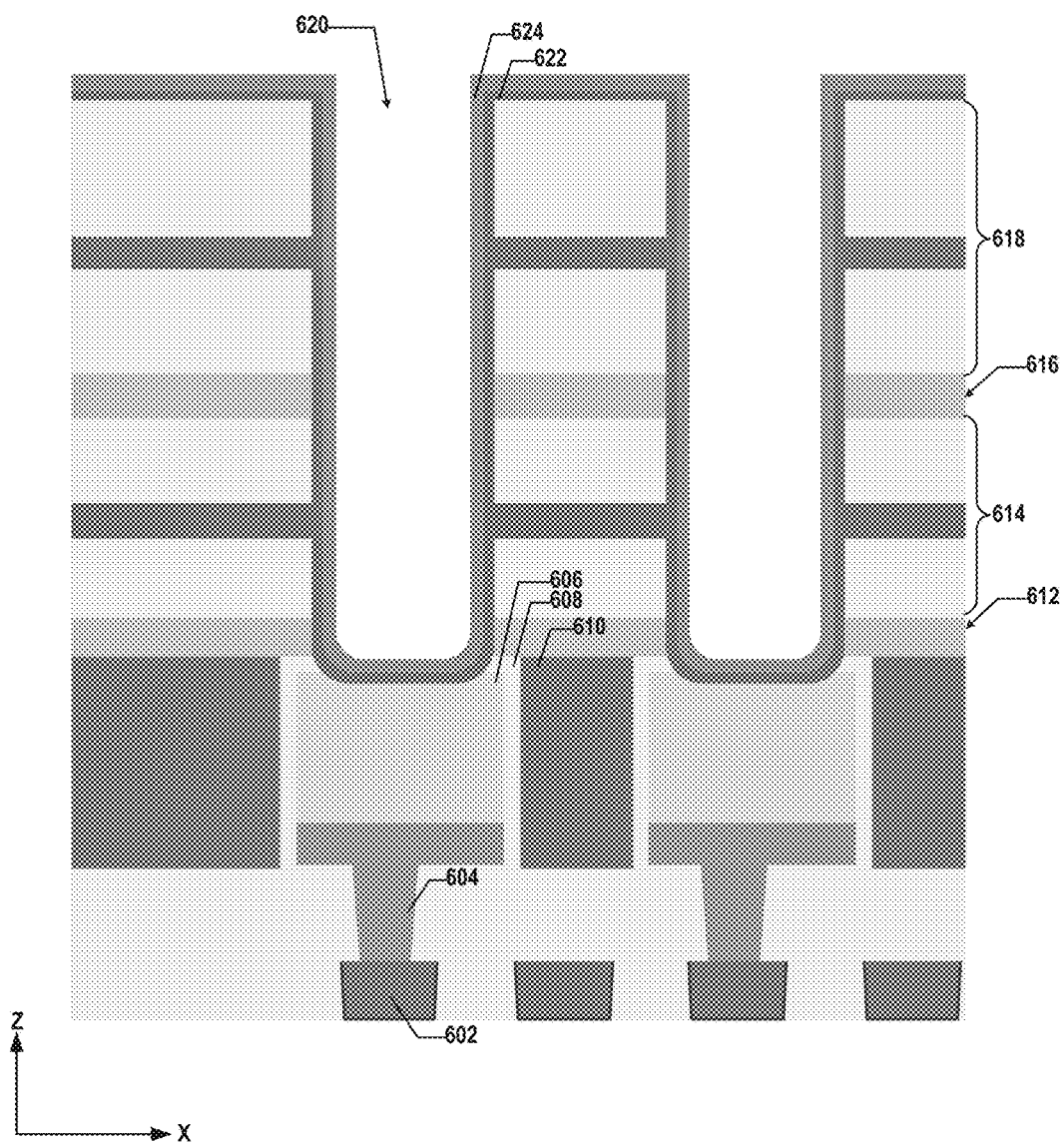

As illustrated in FIG. 6D, an opening 620 can be etched through upper capacitor gate stack 618, a sacrificial layer 616, lower capacitor gate stack 614, separation layer 612, and gate dielectric layer 608, until the upper portion of channel structure 606 (i.e., the source/drain region). Opening 620 can be formed by wet etching and/or dry etching of dielectric materials (e.g., silicon oxide, silicon nitride, and high-k dielectrics) and conductive materials (e.g., W). A second electrode 622 can be formed by depositing a conductive film (e.g., a metal film) on the sidewalls and bottom surface of opening 620 using one or more thin film deposition processes including, but not limited to, CVD, PVD, ALD, electrochemical depositions, or any combination thereof. The resulting conductive film of second electrode 622 can be electrically connected to the conductor layers in capacitor gate stack 614 and 618. A ferroelectric layer 624 can be formed along and in contact with second electrode 622. Ferroelectric layer 624 can cover second electrode 622 formed in opening 620, e.g., on the sidewalls and bottom surface of opening 620. Ferroelectric layer 624 can include a ferroelectric binary composite oxide film deposited by one or more thin film deposition processes including, but not limited to, CVD, PVD, ALD, electrochemical depositions, or any combination thereof.

Figure 6E:
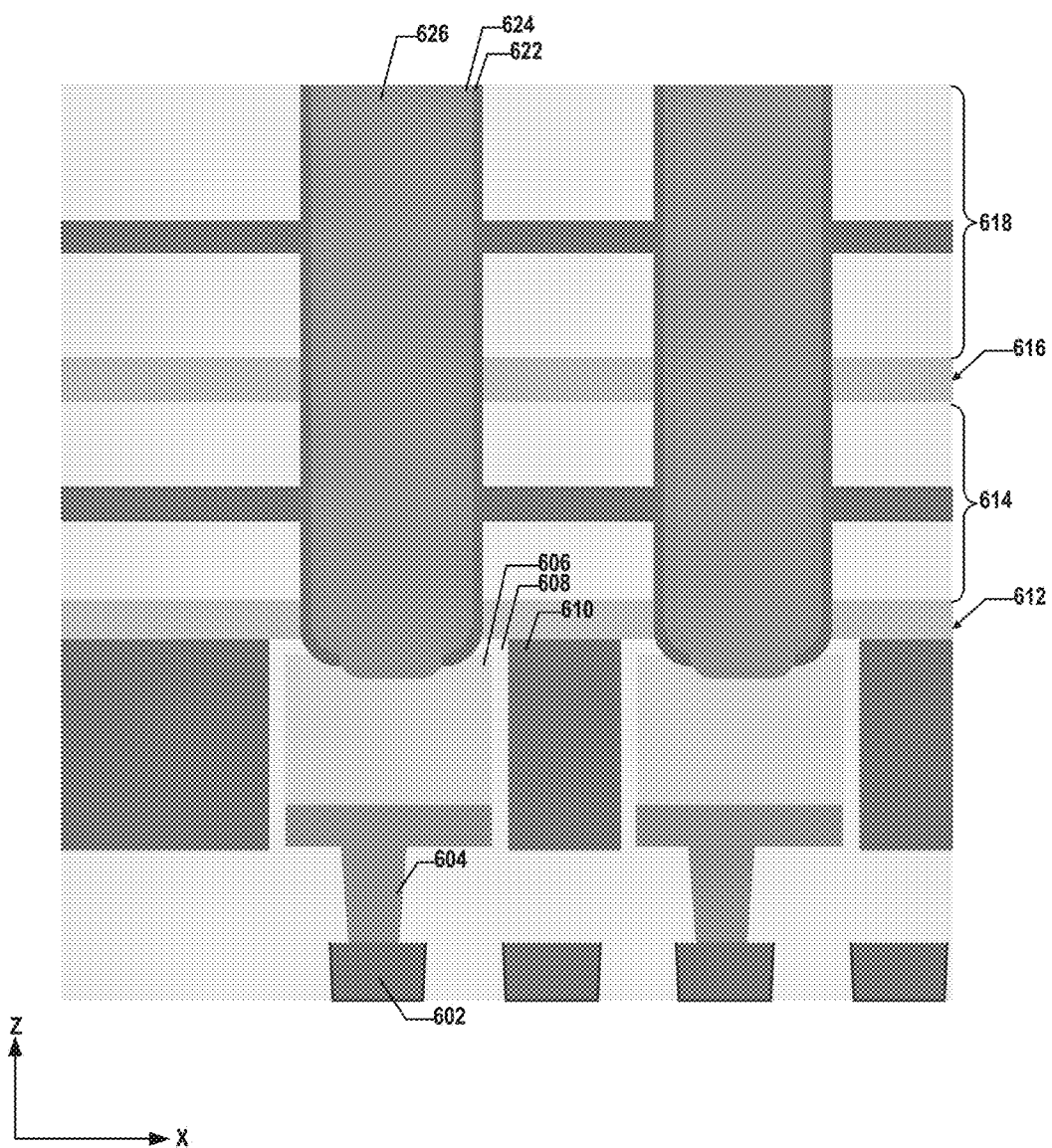

As illustrated in FIG. 6E, second electrode 622 and ferroelectric layer 624 are not formed on the top surface of upper capacitor gate stack 618. Any part of conductive film and ferroelectric binary composite oxide film formed on the top surface of upper capacitor gate stack 618 can be removed by patterning of a sacrificial/protective layer and etching of the sacrificial/protective layer, the conductive film and the ferroelectric binary composite oxide film. As illustrated in FIG. 6E, second electrode 622 and ferroelectric layer 624 are not formed on the bottom surface of opening 620. The part of conductive film and ferroelectric binary composite oxide film formed on the bottom surface of opening 620 can be removed by a bottom punch process including wet etching and/or dry etching.

As illustrated in FIG. 6E, a first electrode 626 can be formed to fill the remaining space in opening 620. As a result, the sidewalls of first electrode 626 can be in contact with the ferroelectric layer 624, and the bottom portion of first electrode 626 can be in contact with the source/drain region at the top portion of channel structure 606. In some embodiments, a semiconductor film (e.g., silicon film) is first deposited to fill the remaining space in opening 620 and cover ferroelectric layer 624 both inside opening 620 and outside opening 620 (i.e., at the field regions) using one or more thin film deposition processes including, but not limited to, CVD, PVD, ALD, electrochemical depositions, or any combination thereof. The semiconductor film is then patterned and etched, such as by wet/dry etching and/or CMP, to remove at the part outside opening 620 (i.e., at the field regions) to form first electrode 626 as shown in FIG. 6E.

Figure 6F:
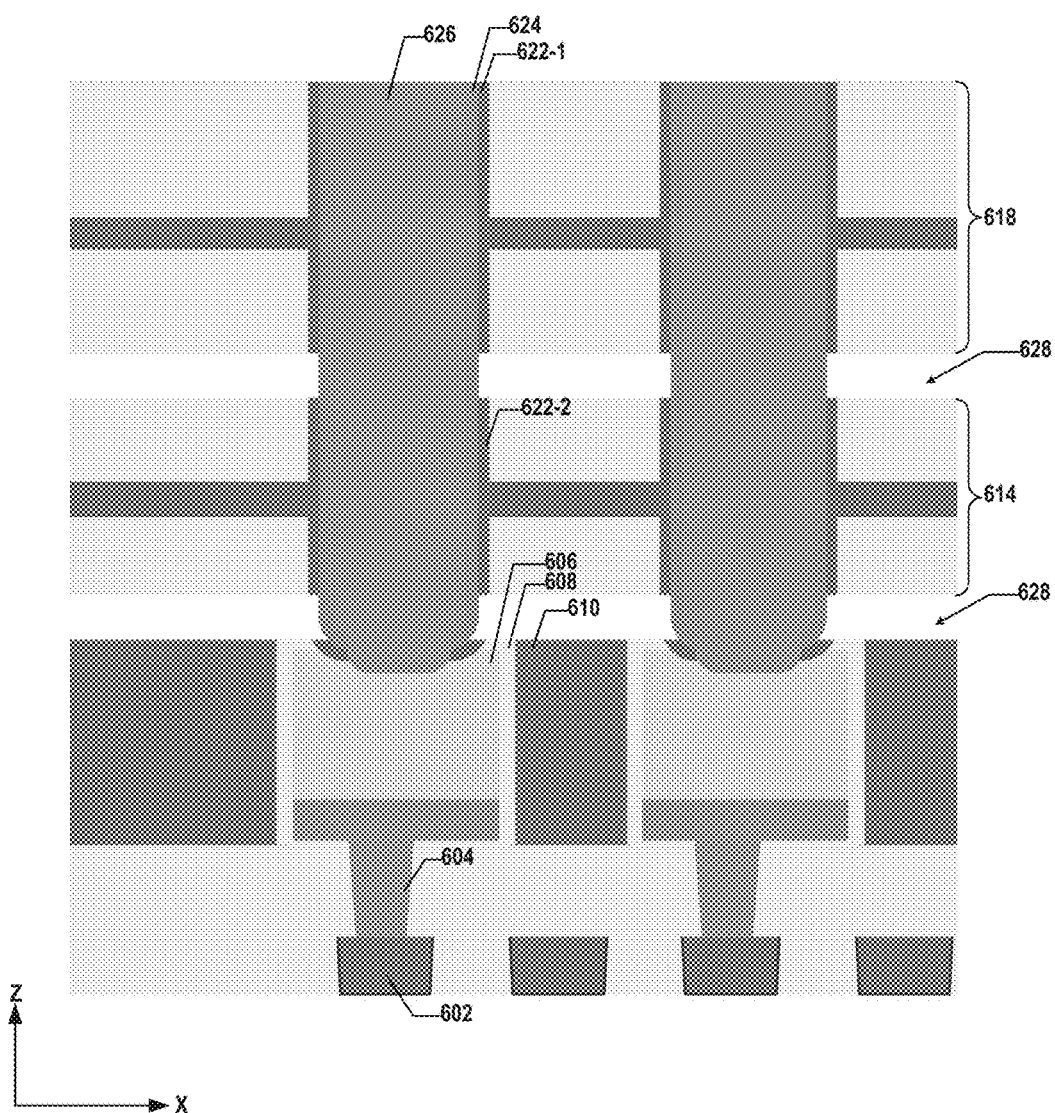

As illustrated in FIG. 6F, separation layer 612 and sacrificial layer 616 can be removed through a slit (not shown) to form lateral recesses 628 using wet etching separation layer 612 and sacrificial layer 616 (e.g., silicon nitride) selective to the dielectric layers (e.g., silicon oxide) in capacitor gate stacks 614 and 618. Lateral recesses 628 can separate second electrode 622 into two electrically-isolated lower electrode 622-2 and upper electrode 622-1 for the two capacitors, respectively. In some embodiments, dielectric materials (e.g., silicon oxide) fill in lateral recesses 628, as shown in FIG. 6H, using one or more film deposition processes, such as PVD, CVD, ALD, electrochemical depositions, any other suitable process, or any combination thereof. In some embodiments, lateral recess 628 can further separate ferroelectric layer 624, so that ferroelectric layer 624 can be separated into a lower portion and an upper portion. That is, ferroelectric layer 624 can become discontinuous.

Figure 6G:
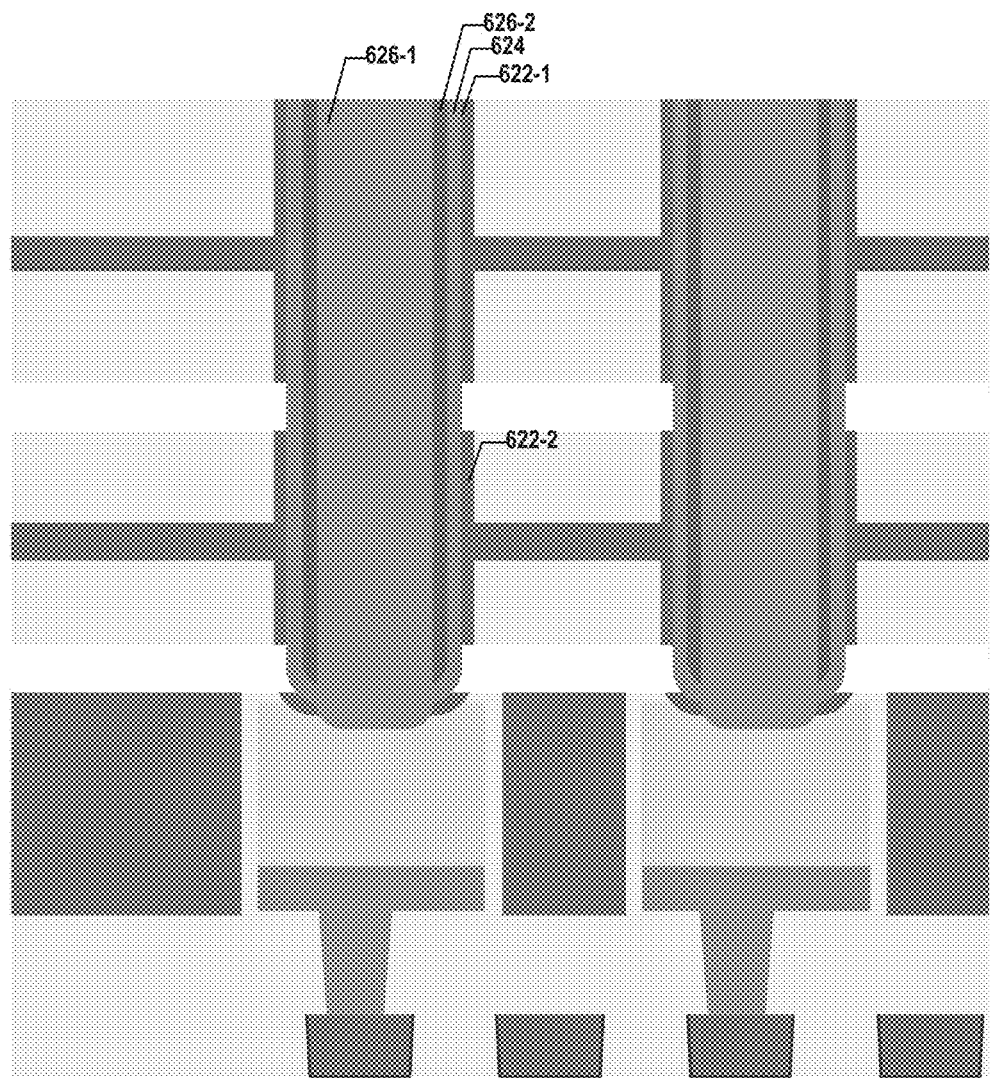
Figure 6H:

As illustrated in FIG. 6G, in some embodiments, first electrode 626 is a composite electrode including a conductive layer 626-2 (e.g., a metal film) formed in contact with ferroelectric layer 624 inside opening 620 prior to forming a semiconductor film 626-1 that fills the remaining space in opening 620.

As illustrated in FIG. 6H, local interconnects, such as gate line contacts 630 and word line contacts 632, can be formed through one or more ILD layers and in contact with the respective gate line and word line in the staircase region. In some embodiments, via openings are first be patterned and etched to by wet etch and/or dry etch. In some embodiments, the via openings can be filled with conductive materials using one or more film deposition processes, such as PVD, CVD, ALD, electrochemical depositions, any other suitable process, or any combination thereof, to form gate line contacts 630 and word line contacts 632.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A three-dimensional (3D) ferroelectric memory device, comprising:
   a substrate;
   a plurality of ferroelectric memory cells each extending vertically above the substrate and comprising:

a capacitor comprising a first electrode, a second electrode, and a ferroelectric layer disposed laterally between the first electrode and the second electrode; and a transistor electrically connected to the capacitor and comprising a channel structure electrically connected to the first electrode, a gate conductor, and a gate dielectric layer disposed laterally between the channel structure and the gate conductor; and a conductor layer extending laterally and in contact with the second electrode, the conductor layer having a different vertical dimension from the second electrode, wherein the second electrode is disposed laterally between the conductor layer and the ferroelectric layer.

2. The 3D ferroelectric memory device of claim 1, wherein the transistor is disposed above the capacitor.

3. The 3D ferroelectric memory device of claim 1, wherein the channel structure is above the first electrode.

4. The 3D ferroelectric memory device of claim 1, further comprising a capacitor gate stack through which the capacitor extends vertically, the capacitor gate stack comprises:
the conductor layer;
a first dielectric layer disposed below the conductor layer; and
a second dielectric layer disposed above the conductor layer.

5. The 3D ferroelectric memory device of claim 4, further comprising a stop layer disposed below the capacitor gate stack, wherein a lower portion of the capacitor is in contact with the stop layer.

6. The 3D ferroelectric memory device of claim 1, further comprising a plurality of bit lines and a plurality of bit line contacts, wherein each of the bit line contacts is in contact with one of the bit lines and a source/drain region of one of the transistors.

7. The 3D ferroelectric memory device of claim 1, wherein each of the ferroelectric memory cell is in a substantially circular shape in a plan view.

8. The 3D ferroelectric memory device of claim 1, wherein the ferroelectric layer comprises oxygen and at least one of hafnium (Hf), zirconium (Zr), titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb).

9. The 3D ferroelectric memory device of claim 1, wherein the first electrode comprises at least one of silicon (Si), transparent conductive oxide (TCO), titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), and ruthenium oxide (RuOx).

10. The 3D ferroelectric memory device of claim 1, further comprising a peripheral device disposed below the ferroelectric memory cells.

11. A three-dimensional (3D) ferroelectric memory device, comprising:
a substrate;
a ferroelectric memory cell extending vertically above the substrate and comprising:
a plurality of capacitors stacked vertically, each of the capacitors comprising a first electrode, a second electrode, and a ferroelectric layer disposed laterally between the first electrode and the second electrode; and a transistor electrically connected to the capacitors and comprising a channel structure electrically connected to the first electrode, a gate conductor, and a gate dielectric layer disposed laterally between the channel structure and the gate conductor; and a conductor layer extending laterally and in contact with one of the second electrodes, the conductor layer having a different vertical dimension from the second electrode.

12. The 3D ferroelectric memory device of claim 11, wherein the first electrodes in each of the ferroelectric memory cells are parts of a continuous electrode.

13. The 3D ferroelectric memory device of claim 12, wherein the channel structure is above and electrically connected to the continuous electrode.

14. The 3D ferroelectric memory device of claim 11, wherein the ferroelectric layers in each of the capacitors are parts of a continuous ferroelectric layer.

15. The 3D ferroelectric memory device of claim 11, wherein the second electrodes in each of the capacitors are electrically isolated from one another.

16. The 3D ferroelectric memory device of claim 15, further comprising a plurality of capacitor gate stacks through which the capacitors extend vertically, each of the capacitor gate stacks comprises:
the conductor layer;
a first dielectric layer disposed below the conductor layer; and
a second dielectric layer disposed above the conductor layer.

17. The 3D ferroelectric memory device of claim 16, further comprising a stop layer disposed below the capacitor gate stacks, wherein a lower portion of the capacitors is in contact with the stop layer.

18. The 3D ferroelectric memory device of claim 11, further comprising a plurality of bit lines and a plurality of bit line contacts, wherein each of the bit line contacts is in contact with one of the bit lines and a source/drain region of one of the transistors.

19. The 3D ferroelectric memory device of claim 11, wherein the ferroelectric layer is part of a continuous layer across at least two of the capacitors.

20. The 3D ferroelectric memory device of claim 11, wherein the ferroelectric layer comprises oxygen and at least one of hafnium (Hf), zirconium (Zr), titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb).

21. The 3D ferroelectric memory device of claim 11, wherein a vertical dimension of at least two of the second electrodes is not the same.

22. The 3D ferroelectric memory device of claim 11, wherein the second electrode is disposed laterally between the conductor layer and the ferroelectric layer.

23. A three-dimensional (3D) ferroelectric memory device, comprising:
a substrate;
a first ferroelectric memory cell extending vertically above the substrate, the first ferroelectric memory cell comprising a first ferroelectric capacitor and a first transistor disposed above and electrically connected to the first ferroelectric capacitor, wherein the first ferroelectric capacitor comprises (i) a first electrode electrically connected to the first transistor, (ii) a second electrode, and (iii) a ferroelectric layer disposed laterally between the first electrode and the second electrode;

a second ferroelectric memory cell extending vertically above the first ferroelectric memory cell, the second ferroelectric memory cell comprising a second transistor and a second ferroelectric capacitor disposed above and electrically connected to the second transistor, wherein the second ferroelectric capacitor comprises (i) a first electrode electrically connected to the second transistor, (ii) a second electrode, and (iii) a ferroelectric layer disposed laterally between the first electrode and the second electrode;

a conductor layer extending laterally and in contact with the second electrode of the first ferroelectric capacitor, the conductor layer having a different vertical dimension from the second electrode of the first ferroelectric capacitor, wherein the second electrode is disposed laterally between the conductor layer and the ferroelectric layer; and a bit line disposed vertically between and electrically connected to the first transistor and the second transistor.

24. The 3D ferroelectric memory device of claim 23, wherein each of the first and second transistors comprises a channel structure, a gate conductor, and a gate dielectric layer disposed laterally between the channel structure and the gate conductor.

25. The 3D ferroelectric memory device of claim 24, wherein:

for the first ferroelectric memory cell, the corresponding channel structure is above and electrically connected to the corresponding first electrode; and for the second ferroelectric memory cell, the corresponding channel structure is below and electrically connected to the corresponding first electrode.

26. The 3D ferroelectric memory device of claim 23, further comprising:

a first bit line contact in contact with the bit line and a source/drain region of the first transistor; and a second bit line contact in contact with the bit line and a source/drain region of the second transistor.

27. The 3D ferroelectric memory device of claim 23, wherein each of the first and second ferroelectric memory cells is in a substantially circular shape in a plan view.

28. The 3D ferroelectric memory device of claim 23, wherein the ferroelectric layer comprises oxygen and at least one of hafnium (Hf), zirconium (Zr), titanium (Ti), aluminum (Al), magnesium (Mg), calcium (Ca), strontium (Sr), barium (Ba), radium (Ra), vanadium (V), niobium (Nb), tantalum (Ta), dubnium (Db), lanthanum (La), cerium (Ce), gadolinium (Gd), dysprosium (Dy), erbium (Er), and ytterbium (Yb).

29. The 3D ferroelectric memory device of claim 23, further comprising:

a third ferroelectric memory cell extending vertically above second ferroelectric memory cell, the third ferroelectric memory cell comprising a third ferroelectric capacitor and a third transistor disposed above and electrically connected to the third ferroelectric capacitor;

a fourth ferroelectric memory cell extending vertically above the third ferroelectric memory cell, the fourth ferroelectric memory cell comprising a fourth transistor and a fourth ferroelectric capacitor disposed above and electrically connected to the fourth transistor; and another bit line disposed vertically between and electrically connected to the third transistor and the fourth transistor.

30. The 3D ferroelectric memory device of claim 23, wherein each of the first and second ferroelectric memory cells comprises a plurality of ferroelectric capacitors stacked vertically.

* * * * *